(12) United States Patent
Yoshimi et al.

(10) Patent No.: US 12,047,041 B2
(45) Date of Patent: Jul. 23, 2024

(54) SEMICONDUCTOR DEVICE

(71) Applicant: Murata Manufacturing Co., Ltd., Kyoto-fu (JP)

(72) Inventors: Shunji Yoshimi, Nagaokakyo (JP); Yuji Takematsu, Nagaokakyo (JP); Yukiya Yamaguchi, Nagaokakyo (JP); Takanori Uejima, Nagaokakyo (JP); Satoshi Goto, Nagaokakyo (JP); Satoshi Arayashiki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 498 days.

(21) Appl. No.: 17/490,798

(22) Filed: Sep. 30, 2021

(65) Prior Publication Data

US 2022/0109411 A1 Apr. 7, 2022

(30) Foreign Application Priority Data

Oct. 7, 2020 (JP) .................. 2020-169894

(51) Int. Cl.
*H03F 3/21* (2006.01)
*H01L 23/522* (2006.01)
(Continued)

(52) U.S. Cl.
CPC ........... *H03F 3/21* (2013.01); *H01L 23/5226* (2013.01); *H01L 23/5383* (2013.01);
(Continued)

(58) Field of Classification Search
CPC ................ H03F 3/21; H03F 2200/294; H03F 2200/451; H03F 3/245; H03F 3/72; H03F 2200/111; H03F 2200/171; H03F 2200/252; H03F 2200/396; H03F 2200/414; H03F 2200/417; H03F 2203/7209; H03F 3/195; H03F 3/213; H01L 23/5226;
(Continued)

(56) References Cited

U.S. PATENT DOCUMENTS 9,344,140 B2 * 5/2016 Reisner ............... H01L 25/0652
2015/0303971 A1 10/2015 Reisner et al.
2016/0343837 A1 11/2016 Sasaki et al.

FOREIGN PATENT DOCUMENTS

TW 201547189 A 12/2015

* cited by examiner

*Primary Examiner* — Hieu P Nguyen
(74) *Attorney, Agent, or Firm* — Studebaker & Brackett PC

(57) ABSTRACT

A semiconductor devices comprises a first member including a first circuit partially formed by an elemental semiconductor element at a surface layer, a first conductive raised portion at the first member, and a second member smaller than the first member in plan view joined to the first member. The second member includes a second circuit partially formed by a compound semiconductor element. A second conductive raised portion is at the second member. A power amplifier includes a first-stage amplifier circuit included in the first or second circuit and a second-stage amplifier circuit included in the second circuit. The first circuit includes a first switch for inputting to the first-stage amplifier circuit a radio-frequency signal inputted to a selected contact, a control circuit to control the first- and second-stage amplifier circuits, and a second switch for outputting from a selected contact a radio-frequency signal outputted by the second-stage amplifier circuit.

20 Claims, 18 Drawing Sheets

(51) Int. Cl.
*H01L 23/538* (2006.01)
*H01L 25/065* (2023.01)
*H01L 29/737* (2006.01)
*H03F 3/195* (2006.01)

(52) U.S. Cl.
CPC ...... *H01L 25/0655* (2013.01); *H01L 25/0657* (2013.01); *H01L 29/7371* (2013.01); *H01L 2225/06517* (2013.01); *H03F 2200/294* (2013.01); *H03F 2200/451* (2013.01)

(58) Field of Classification Search
CPC ............. H01L 23/5383; H01L 25/0655; H01L 25/0657; H01L 29/7371; H01L 2225/06517; H01L 24/17; H01L 24/16; H01L 25/16; H01L 2224/04026; H01L 2224/05548; H01L 2224/32145; H01L 23/552; H01L 2224/0401; H01L 2224/06102; H01L 2224/13022; H01L 2224/13082; H01L 2224/1403; H01L 2224/73253; H01L 2224/94; H01L 2225/06537; H01L 2225/06589; H01L 2924/13051; H01L 2924/19041; H01L 2924/19042; H01L 2924/19043; H01L 23/3675; H01L 23/3677; H01L 23/49811; H01L 24/10; H01L 2224/16225; H01L 2924/15311; H01L 2924/181; H01L 2924/19105
USPC ........................... 330/307, 310, 98, 133, 150
See application file for complete search history.

SEMICONDUCTOR DEVICE

CROSS-REFERENCE TO RELATED APPLICATION

This application claims benefit of priority to Japanese Patent Application No. 2020-169894, filed Oct. 7, 2020, the entire content of which is incorporated herein by reference.

BACKGROUND

Technical Field

The present disclosure relates to a semiconductor device.

Background Art

Radio-frequency (RF) front-end modules capable of both transmitting and receiving radio-frequency signals are installed in electronic devices for communications such as mobile communications and satellite communications. An RF front-end module includes, for example, a monolithic microwave integrated circuit (MMIC) capable of amplifying radio-frequency signals, a control integrated circuit (IC) for controlling a radio-frequency amplifier circuit, a switch IC, and a duplexer.

U.S. Patent Application Publication No. 2015/0303971 discloses a miniaturized structure formed by stacking a control IC on an MMIC. The module disclosed in U.S. Patent Application Publication No. 2015/0303971 includes the MMIC mounted on a module substrate and the control IC stacked on the MMIC. Electrodes of the MMIC, electrodes of the control IC, and electrodes on the module substrate are electrically coupled to each other by wire bonding.

SUMMARY

In a radio-frequency amplifier circuit, for example, a heterojunction bipolar transistor (HBT) is utilized. While an HBT operates, the HBT generates heat because collector dissipation occurs. A temperature rise of the HBT caused by heat generation in turn increases collector current. When conditions for this positive feedback are satisfied, thermal runaway occurs in the HBT. To avoid thermal runaway in the HBT, an upper limit of output power of the HBT is set.

To implement radio-frequency amplifier circuits with high power output, it is desirable to improve the characteristic of heat released from a semiconductor element constituting an MMIC, such as an HBT. It is difficult to satisfy recent demand for radio-frequency amplifier circuits with high power output by using the module structure disclosed in U.S. Patent Application Publication No. 2015/0303971. Thus, the present disclosure provides a semiconductor device that can improve the characteristic of heat released from a semiconductor element.

According to an aspect of the present disclosure, a semiconductor device includes a first member including a first electronic circuit partially formed by a semiconductor element that is made from an elemental semiconductor and that is disposed at a surface layer portion, at least one first conductive raised portion disposed on one surface of the first member and coupled to the first electronic circuit, and a second member joined to the one surface of the first member on which the first conductive raised portion is disposed. The second member is smaller than the first member in plan view. The second member includes a second electronic circuit partially formed by a semiconductor element made from a compound semiconductor, and at least one second conductive raised portion disposed at the second member, coupled to the second electronic circuit, and raised in a direction identical to a direction in which the first conductive raised portion is raised. The second electronic circuit includes the second-stage amplifier circuit. Either the first electronic circuit or the second electronic circuit includes the first-stage amplifier circuit. The first-stage amplifier circuit is configured to amplify a radio-frequency signal and input the radio-frequency signal to the second-stage amplifier circuit. The first electronic circuit includes a first switch configured to cause a radio-frequency signal inputted to a contact selected from a plurality of contacts to be inputted to the first-stage amplifier circuit, a control circuit configured to control the operation of the first-stage amplifier circuit and the operation of the second-stage amplifier circuit, and a second switch configured to cause a radio-frequency signal outputted by the second-stage amplifier circuit to be outputted from a contact selected from a plurality of contacts.

Heat generated at the semiconductor element of the second member is transferred through the second conductive raised portion to the first member. The heat is transferred from the second member toward both the second conductive raised portion and the first member, and as a result, it is possible to achieve an advantageous effect of improving the characteristic of heat released from the second member. Usually, the thermal conductivity of a main material of the first member at which an elemental semiconductor element is formed is higher than the thermal conductivity of a main material of the second member at which a compound semiconductor element is formed. Hence, heat transferred from the second member to the first member diffuses in the first member larger than the second member. The heat diffusing in the first member is released outwards. As a result, it is possible to achieve an advantageous effect of further improving the characteristic of heat released from the second member.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will be described with reference to FIGS. 1 to 8.

Figure 1:
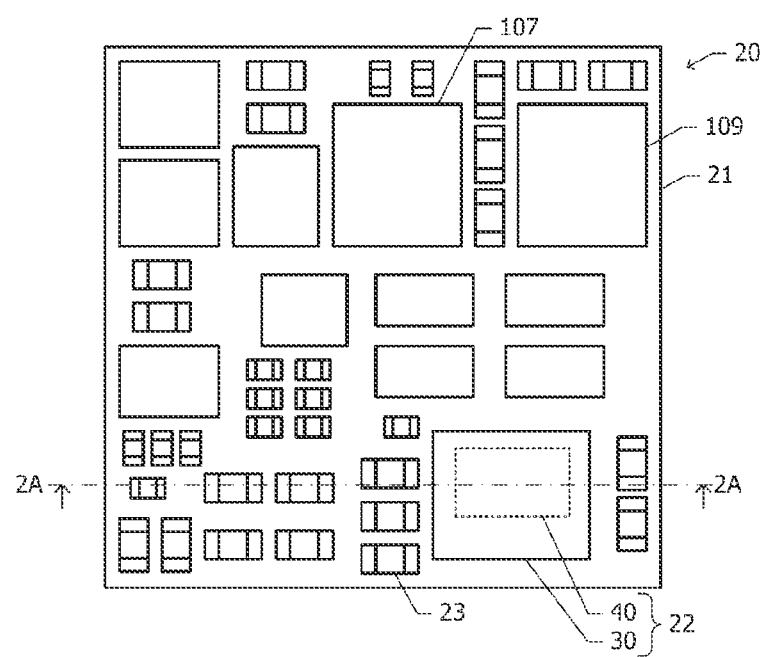
FIG. 1 is a schematic plan view of a radio-frequency module including a semiconductor device according to a first embodiment.

FIG. 1 is a schematic plan view of a radio-frequency module 20 including a semiconductor device 22 according to the first embodiment. A semiconductor device 22, low-noise amplifiers 109, an antenna switch (fourth switch) 107, and other surface mount devices 23 are mounted at a module substrate 21. The low-noise amplifiers 109 and the antenna switch 107 are each implemented by an integrated circuit element made from an elemental semiconductor such as silicon or germanium. The surface mount devices 23 are passive components including, for example, an inductor, a capacitor, and a resistance element. The semiconductor device 22 includes a first member 30 and a second member 40 joined to a lower surface (surface facing the module substrate 21) of the first member 30. When viewed in plan view, the second member 40 is smaller than the first member 30, and the second member 40 is surrounded by the first member 30. For example, the first member 30 is made from an elemental semiconductor, and the second member 40 is made from a compound semiconductor.

Figure 2A:
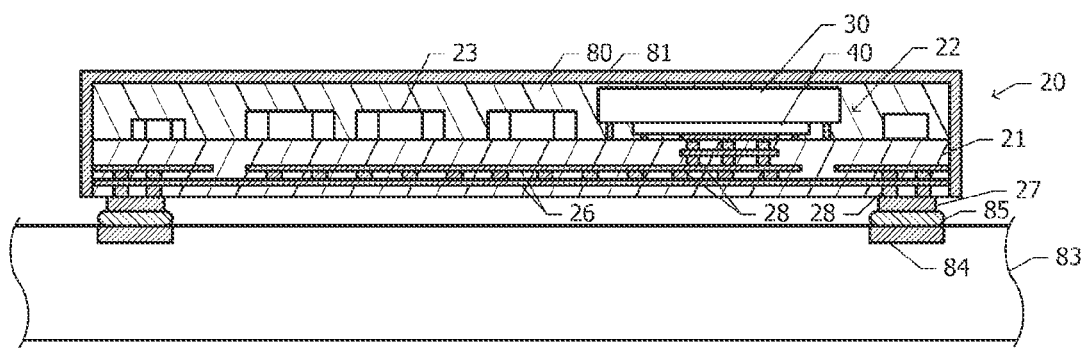
FIG. 2A is a sectional view taken along a dot-dash line 2A-2A in FIG. 1.
Figure 2B:
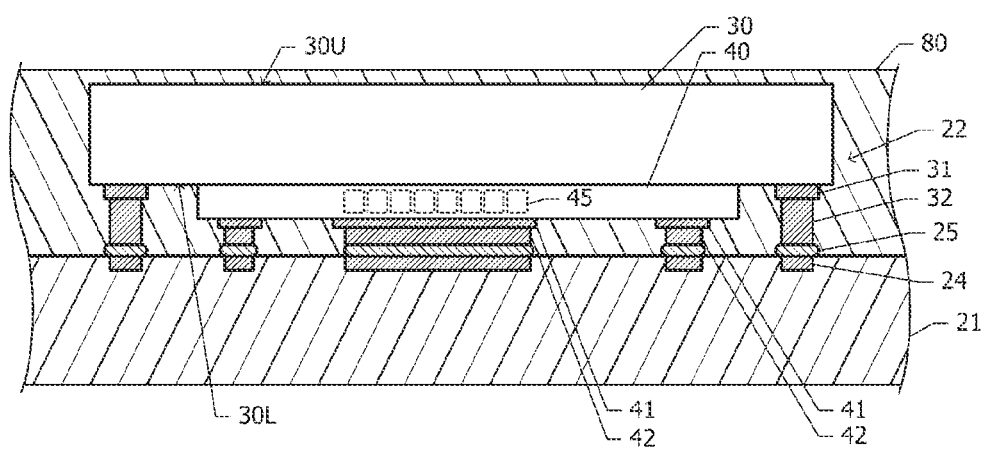
FIG. 2B is an enlarged sectional view of the semiconductor device with a surrounding part.

FIG. 2A is a sectional view taken along a dot-dash line 2A-2A in FIG. 1. FIG. 2B is an enlarged sectional view of the semiconductor device 22 with a surrounding part. In FIG. 2A, the radio-frequency module 20 is mounted on a motherboard 83.

Firstly, a structure of the semiconductor device 22 will be described with reference to FIG. 2B. The semiconductor device 22 includes the plate-like first member 30 and the film-like second member 40 joined to the first member 30. Of two surfaces of the first member 30 perpendicular to the thickness direction, the surface facing the module substrate 21 is referred to as a lower surface 30L, and the surface opposite to the lower surface is referred to as a top surface 30U. The second member 40 is joined to the lower surface 30L of the first member 30. The second member 40 is thermally coupled to the first member 30. The second member 40 includes a plurality of semiconductor elements 45. The plurality of semiconductor elements 45 are each a compound semiconductor element such as an HBT.

A plurality of pads 31 are disposed at an area of the lower surface 30L of the first member 30 not overlapping the second member 40. A first conductive raised portion 32 is disposed on each of the plurality of pads 31 (on a surface toward the same direction as the lower surface 30L). A plurality of pads 41 are disposed on a surface of the second member 40 facing the module substrate 21 (on a surface toward the same direction as the lower surface 30L of the first member 30). A second conductive raised portion 42 is disposed on each of the plurality of pads 41. The first conductive raised portion 32 disposed at the first member 30 and the second conductive raised portion 42 disposed at the second member 40 are raised from the first member 30 or the second member 40 in the same direction. At least one of the second conductive raised portions 42 is disposed under the plurality of semiconductor elements 45 in plan view.

A plurality of lands 24 are disposed on an upper surface of the module substrate 21. The first conductive raised portions 32 at the first member 30 and the second conductive raised portion 42 at the second member 40 are individually joined to the lands 24 at the module substrate 21 by solder joints 25. As described above, the semiconductor device 22 including the first member 30 and the second member 40 is mounted on the module substrate 21 by flip chip bonding.

As illustrated in FIG. 2A, the other surface mount devices 23 are mounted on the module substrate 21 in addition to the semiconductor device 22. At least one layer of ground plane 26 is provided as an inner layer of the module substrate 21. Of the second conductive raised portions 42 (FIG. 2B) at the second member 40, one second conductive raised portion 42 disposed under the semiconductor elements 45 in plan view is electrically and thermally coupled to the ground plane 26 via the solder joint 25 (FIG. 2B), the land 24 (FIG. 2B), and a via hole 28 in the module substrate 21.

A plurality of connection terminals 27 are disposed on a lower surface (surface opposite to the surface with the semiconductor device 22) of the module substrate 21. At least one of the connection terminals 27 is coupled to the ground plane 26 via the via hole 28.

The upper surface of the module substrate 21, and the semiconductor device 22 and the surface mount devices 23 mounted on the module substrate 21 are covered with a sealing material 80. Of surfaces of the sealing material 80, a surface toward the same direction as the top surface of the first member 30 is referred to as a top surface, and surfaces extending from edges of the top surface to the module substrate 21 are referred to as side surfaces. The side surfaces of the sealing material 80 are smoothly connected to side surfaces of the module substrate 21.

The top surface and side surfaces of the sealing material 80 and the side surfaces of the module substrate 21 are covered by a metal film 81. The metal film 81 can be formed from, for example, Cu or Al by employing a technique such as sputtering. The metal film 81 is connected to the ground plane 26 at the side surfaces of the module substrate 21. The metal film 81 functions as a shield film for electromagnetically shielding an electronic circuit constituted by the semiconductor device 22 and the surface mount devices 23 mounted on the module substrate 21 from the outside.

A plurality of lands 84 are disposed on an upper surface of the motherboard 83. The plurality of connection terminals 27 at the module substrate 21 are individually connected to the lands 84 at the motherboard 83 by using solder joints 85, so that the radio-frequency module 20 is mounted on the motherboard 83.

Figure 3:
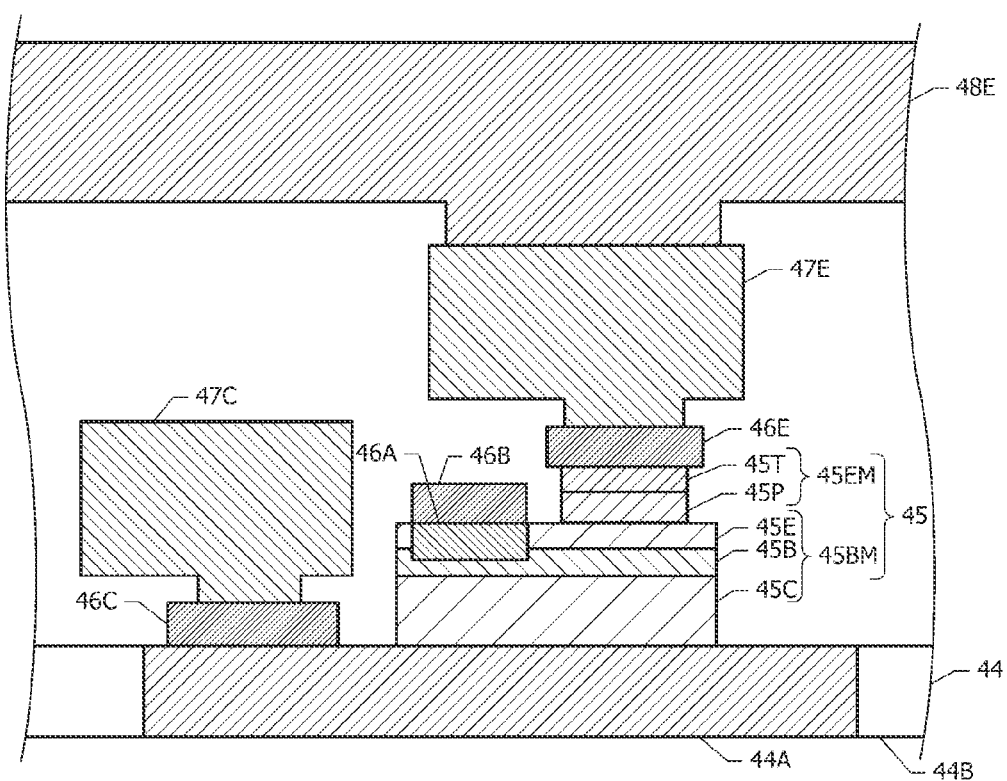
FIG. 3 is an enlarged sectional view of one of semiconductor elements included in a second member.

FIG. 3 is an enlarged sectional view of one of the semiconductor elements 45 included in the second member 40. The second member 40 includes a semiconductor thin film 44, the semiconductor elements 45, and various electrodes and wires. The semiconductor thin film 44 is joined to the first member 30 (FIG. 2B). The sectional view illustrated in FIG. 3 is upside down with respect to the sectional views illustrated in FIGS. 2A and 2B. In the description of FIG. 3, the side corresponding to the lower side in FIGS. 2A and 2B is referred to as the upper side.

The semiconductor thin film 44 is formed from a compound semiconductor such as GaAs. The semiconductor thin film 44 is divided into a conductive N-type subcollector layer 44A and a non-conductive element isolation area 44B. The semiconductor element 45 is formed on the subcollector layer 44A.

The semiconductor element 45 includes a base mesa 45BM formed on the subcollector layer 44A and an emitter mesa 45EM formed at an area of an upper surface of the base mesa 45BM. The base mesa 45BM includes a collector layer 45C, a base layer 45B, and an emitter layer 45E, which are stacked on the subcollector layer 44A in order; in other words, when named from the one close to the first member 30 (FIG. 4), the collector layer 45C, the base layer 45B, and the emitter layer 45E are stacked in the order presented. The emitter mesa 45EM includes a cap layer 45P and a contact layer 45T disposed on the cap layer 45P.

For example, the collector layer 45C is made from N-type GaAs, the base layer 45B is made from P-type GaAs, and the emitter layer 45E is made from N-type InGaP; the cap layer 45P is made from N-type GaAs, and the contact layer 45T is made from N-type InGaAs. The semiconductor element 45 constituted by the base mesa 45BM and the emitter mesa 45EM is an HBT. While the semiconductor element 45 operates, heat is generated mainly at the collector layer 45C located under the emitter mesa 45EM.

A collector electrode 46C is disposed on an area of the subcollector layer 44A without the base mesa 45BM. A first-layer collector wire 47C is disposed on the collector electrode 46C. FIG. 3 does not illustrate the specific structure of interlayer insulating films between wiring layers. The collector wire 47C is electrically coupled to the collector layer 45C via the collector electrode 46C and the subcollector layer 44A.

A base electrode 46B is disposed on an area of the emitter layer 45E without the emitter mesa 45EM. The base electrode 46B is electrically coupled to the base layer 45B via an alloyed area 46A extending through the emitter layer 45E in the thickness direction to the base layer 45B.

An emitter electrode 46E is disposed on the emitter mesa 45EM. The emitter electrode 46E is electrically coupled to the emitter layer 45E via the contact layer 45T and the cap layer 45P. The emitter layer 45E located under the emitter mesa 45EM practically functions as an emitter area.

A first-layer emitter wire 47E is disposed on the emitter electrode 46E. A second-layer emitter wire 48E is disposed on the emitter wire 47E. The second-layer emitter wire 48E is electrically coupled to the emitter electrode 46E via the first-layer emitter wire 47E. At least one of the pads 41 (FIG. 2B) is disposed on the second-layer emitter wire 48E. This pad 41 is electrically coupled to the emitter layer 45E of the semiconductor element 45.

Figure 4:
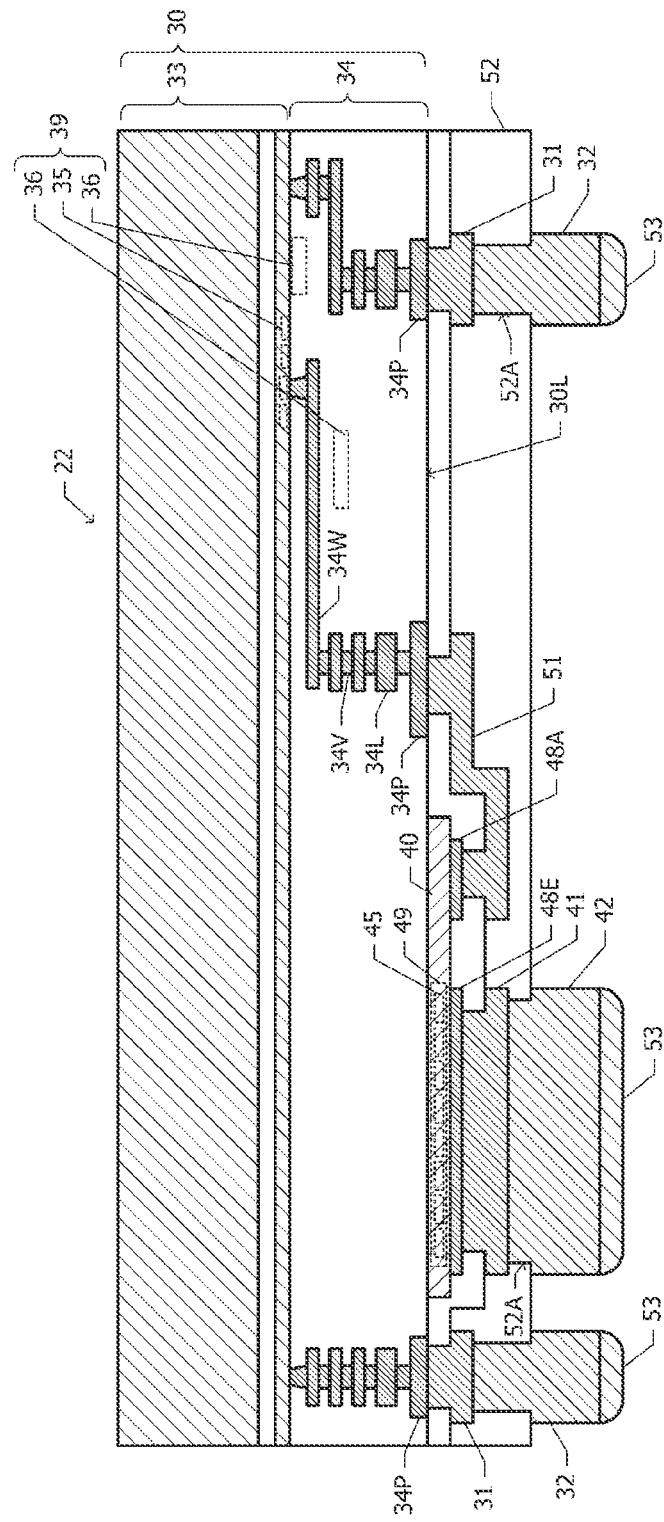
FIG. 4 is a sectional view of the semiconductor device according to the first embodiment.

FIG. 4 is a sectional view of the semiconductor device 22 according to the first embodiment. Firstly, a structure of the first member 30 will be described.

The first member 30 includes a substrate 33 and a multilayer wiring structure 34 disposed on the substrate 33 (on the downward surface in FIG. 4). For example, a silicon-on-insulator (SOI) substrate may be used as the substrate 33. For example, a general silicon substrate may be used as the substrate 33. The multilayer wiring structure 34 is disposed on the lower surface 30L side with respect to the substrate 33. Elements including a plurality of silicon-based semiconductor elements 35 are formed at a surface layer portion of the substrate 33. The plurality of semiconductor elements 35 form, for example, a complementary metal-oxide semiconductor (CMOS) circuit.

The multilayer wiring structure 34 includes a plurality of wires 34W, a plurality of inner-layer lands 34L, a plurality of via holes 34V for connecting layers, and a plurality of pads 34P disposed on the lower-surface side of the multilayer wiring structure 34. FIG. 4 does not illustrate the structure of interlayer insulating films in the multilayer wiring structure 34. A plurality of passive elements 36 are disposed on the downward surface of the substrate 33 or at an inner layer of the multilayer wiring structure 34. The semiconductor elements 35, the passive elements 36, and elements in the multilayer wiring structure 34 such as the wires 34W, the via holes 34V, and the inner-layer lands 34L together form a first electronic circuit 39. This means that the first member 30 includes the first electronic circuit 39. The plurality of pads 34P are coupled to the first electronic circuit 39.

The second member 40 is joined to an area of the lower surface 30L of the first member 30. The plurality of semiconductor elements 45 included in the second member 40 form a second electronic circuit 49. This means that the second member 40 includes the second electronic circuit 49. The second member 40 includes the emitter wire 48E (FIG. 3) and a pad 48A, which are disposed on a downward surface of the second member 40.

A redistribution layer is disposed on the first member 30 and the second member 40 (under the first member 30 and the second member 40 in FIG. 4) with an interlayer insulating film interposed therebetween. The structure of the interlayer insulating film between the redistribution layer and the first member 30 and the second member 40 is not described here. The redistribution layer includes the plurality of pads 31, the pads 41, and an inter-member connection wire 51, which are formed by metal patterns. The inter-member connection wire 51 connects the first electronic circuit 39 included in the first member 30 and the second electronic circuit 49 included in the second member 40.

A protection film 52 covers the plurality of pads 31, the pads 41, and the inter-member connection wire 51 included in the redistribution layer. A plurality of openings 52A are provided at the protection film 52. The plurality of pads 31 and the pads 41 include the plurality of openings 52A in plan view. The second conductive raised portion 42 is disposed on each of the plurality of pads 41. The first conductive raised portion 32 is disposed on each of the plurality of pads 31. The first conductive raised portions 32 and the second conductive raised portions 42 are raised downwards from a lower surface of the protection film 52. A solder joint 53 is laid on a downward surface of each of the first conductive raised portions 32 and the second conductive raised portions 42. The first conductive raised portions 32 and the second conductive raised portions 42 are made by using, for example, Cu. In this case, the first conductive raised portion 32 and the solder joint 53 thereon and the second conductive raised portion 42 and the solder joint 53 thereon are each referred to as a Cu pillar bump.

Figure 5:
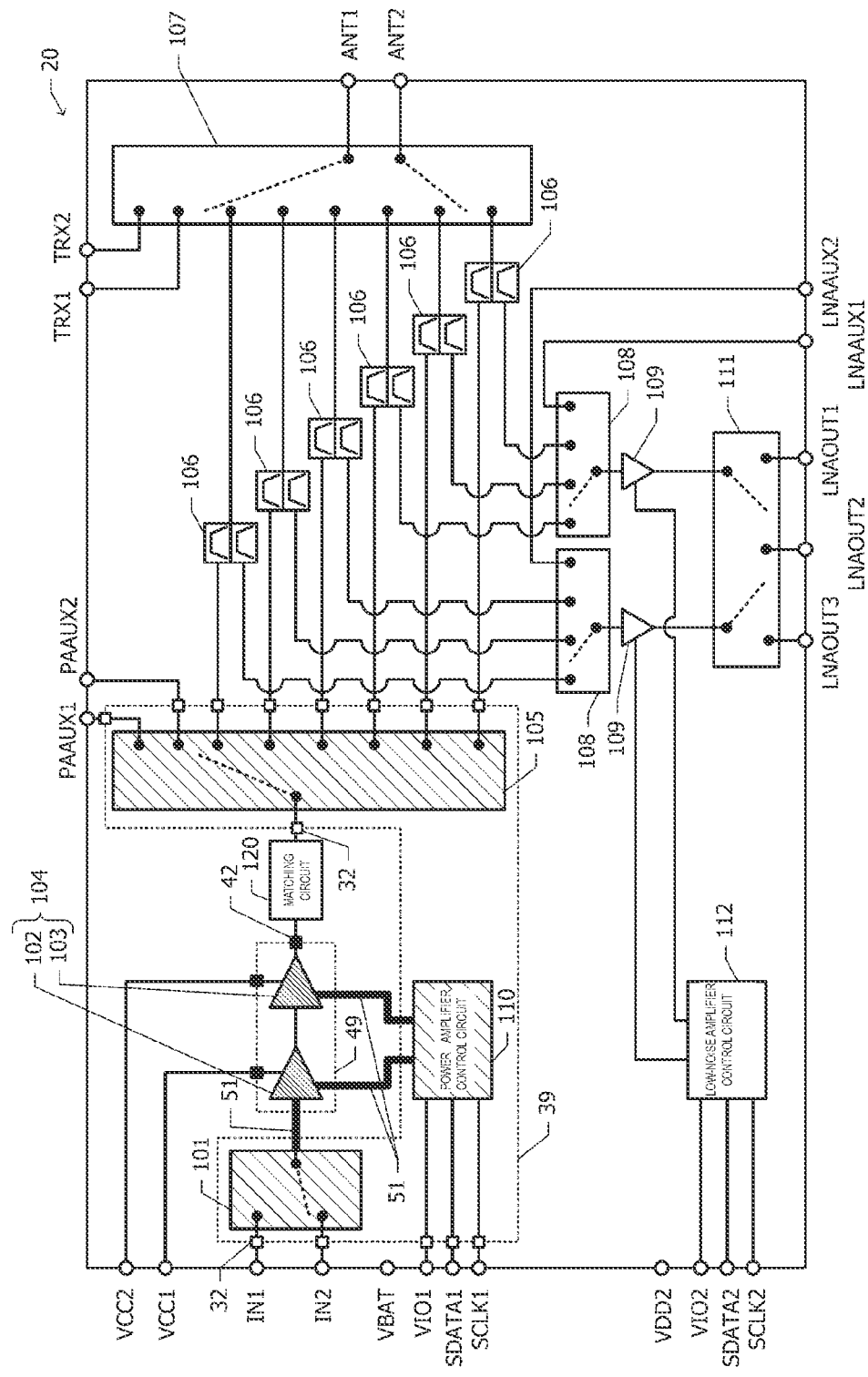
FIG. 5 is a block diagram illustrating a circuit configuration of the radio-frequency module including the semiconductor device according to the first embodiment.

FIG. 5 is a block diagram illustrating a circuit configuration of the radio-frequency module 20 including the semiconductor device 22 (FIG. 4) according to the first embodiment. The radio-frequency module 20 includes an input switch (first switch) 101, a power amplifier 104, a band selection switch (second switch) 105 for transmitting signals, a plurality of duplexers 106, the antenna switch (fourth switch) 107, two band selection switches (fifth switch) 108 for received signals, the two low-noise amplifiers 109, a power amplifier control circuit 110, an output-terminal selection switch (sixth switch) 111 for received signals, and a low-noise amplifier control circuit 112. The power amplifier 104 includes a first-stage amplifier circuit 102 and a second-stage amplifier circuit 103. The radio-frequency module 20 transmits and receives signals in accordance with a frequency division duplex (FDD) system. The radio-frequency module 20 may include a single power amplifier 104 or a plurality of power amplifiers 104. The power amplifier 104 may have a three-stage configuration including the anterior amplifier circuit 102, the second-stage amplifier circuit 103, and another amplifier circuit.

The second electronic circuit 49 of the second member 40 (FIG. 4) includes the first-stage amplifier circuit 102 and the second-stage amplifier circuit 103 of the power amplifier 104. The first electronic circuit 39 of the first member 30 (FIG. 4) includes the input switch 101, the band selection switch 105, and the power amplifier control circuit 110. The other functions are implemented by electronic components installed at the module substrate 21 (FIG. 2A). In FIG. 5, the electronic components included in the first electronic circuit 39 are shaded with hatching in a lighter color, and the electronic components included in the second electronic circuit 49 are shaded with hatching in a darker color. The electronic components included in the first electronic circuit 39 and the electronic components included in the second electronic circuit 49 are shaded with hatching in the same manner in block diagrams in FIGS. 9 to 18 described later.

Next, a configuration and function of the radio-frequency module 20 will be described. Two input-side contacts of the input switch 101 are coupled to radio-frequency-signal input terminals IN1 and IN2 of the module substrate 21 via the first conductive raised portions 32 (FIG. 2B) provided at the first member 30. In FIG. 5, the first conductive raised portions 32 are indicated by white squares. Radio-frequency signals are inputted from the two radio-frequency-signal input terminals IN1 and IN2. The input switch 101 selects one contact from the two input-side contacts to cause a radio-frequency signal inputted to the selected contact to be inputted to the first-stage amplifier circuit 102. The inter-member connection wire 51 (FIG. 4) is used to connect the input switch 101 and an input port of the first-stage amplifier circuit 102. In FIG. 5, connections with the inter-member connection wire 51 are indicated by thicker solid lines. The inter-member connection wire 51 is indicated by thicker solid lines also in the block diagrams in FIGS. 9 to 18.

A radio-frequency signal amplified by the first-stage amplifier circuit 102 is inputted to the second-stage amplifier circuit 103. A radio-frequency signal amplified by the second-stage amplifier circuit 103 is inputted to an input-side contact of the band selection switch 105 through a transmit-side matching circuit 120. An output port of the second-stage amplifier circuit 103 is coupled to the transmit-side matching circuit 120 via the second conductive raised portion 42 (FIG. 2B) provided at the second member 40. In FIG. 5, the second conductive raised portions 42 are indicated by black squares. The transmit-side matching circuit 120 is coupled to the input-side contact of the band selection switch 105 via the first conductive raised portion 32. The band selection switch 105 selects one contact from a plurality of output-side contacts to cause a radio-frequency signal amplified by the second-stage amplifier circuit 103 to be outputted from the selected contact.

Two contacts of the plurality of output-side contacts of the band selection switch 105 are coupled to auxiliary output terminals PAAUX1 and PAAUX2 via the first conductive raised portions 32 (FIG. 3B). The other six contacts are coupled to input ports for transmitting signals of the plurality of duplexers 106 prepared for different bands via the first conductive raised portions 32 (FIG. 3B). The band selection switch 105 has a function of selecting one duplexer 106 from the plurality of duplexers 106 prepared for different bands.

The antenna switch 107 includes a plurality of circuit-side contacts and two antenna-side contacts. Two contacts of the plurality of circuit-side contacts of the antenna switch 107 are individually coupled to transmit-signal input terminals TRX1 and TRX2. The other six circuit-side contacts are respectively coupled to input-output common ports of the duplexers 106. The antenna-side two contacts are individually coupled to antenna terminals ANT1 and ANT2. An antenna is coupled to each of the antenna terminals ANT1 and ANT2. It should be noted that embodiments indicate the example of two antenna terminals, but three or more antenna terminals may be included.

The antenna switch 107 connects the two antenna-side contacts individually to two contacts selected from the plurality of circuit-side contacts. When a single band is used for communication, the antenna switch 107 connects one circuit-side contact to one antenna-side contact. A radio-frequency signal amplified by the power amplifier 104 and transmitted through one duplexer 106 corresponding to the band is transmitted from an antenna coupled to the selected antenna-side contact.

The two band selection switches 108 for received signals each include four input-side contacts. Three contacts of the four input-side contacts of each of the two band selection switches 108 are individually coupled to output ports for received signals of the duplexers 106. The other one contact of each of the two band selection switches 108 is coupled to auxiliary input terminal LNAAUX1 or LNAAUX2.

The two low-noise amplifiers 109 are prepared for the two band selection switches 108 for received signals. The two band selection switches 108 for received signals each cause a receive signal having passed through the duplexer 106 to be inputted to the corresponding low-noise amplifier 109. The radio-frequency module 20 may include a single low-noise amplifier 109 or three or more low-noise amplifiers 109.

Two circuit-side contacts of the output-terminal selection switch 111 are individually coupled to output ports of the two low-noise amplifiers 109. Three terminal-side contacts of the output-terminal selection switch 111 are individually coupled to receive-signal output terminals LNAOUT1, LNAOUT2, and LNAOUT3. A receive signal amplified by the low-noise amplifier 109 is outputted from a receive-signal output terminal selected by the output-terminal selection switch 111. Although in this embodiment three receive-signal output terminals are included, four or more receive-signal output terminals may be included.

Supply voltage is applied to the first-stage amplifier circuit 102 and the second-stage amplifier circuit 103 from power supply terminals VCC1 and VCC2. The power supply terminals VCC1 and VCC2 are coupled to the power amplifier 104 via the second conductive raised portions 42 (FIG. 2B) provided at the second member 40. At least one of the second conductive raised portions 42 provided at the second member 40 is coupled to the ground plane 26 (FIG. 2A) of the module substrate 21, which is not illustrated in FIG. 5.

The power amplifier control circuit 110 is coupled to a power supply terminal VIO1 a control-signal terminal SDATA1, and a clock terminal SCLK1 via the first conductive raised portions 32 (FIG. 2B) provided at the first member 30. The power amplifier control circuit 110 controls the power amplifier 104 in accordance with a control signal supplied to the control-signal terminal SDATA1. The inter-member connection wire 51 (FIG. 4) is used to connect the power amplifier control circuit 110 and the power amplifier 104.

The low-noise amplifier control circuit 112 is coupled to a power supply terminal VIO2, a control-signal terminal SDATA2, and a clock terminal SCLK2. The low-noise amplifier control circuit 112 controls the low-noise amplifiers 109 in accordance with a control signal supplied to the control-signal terminal SDATA2.

A power supply terminal VBAT and a drain-voltage terminal VDD2 are provided at the module substrate 21. Power is supplied to a bias circuit of the power amplifier 104 and the power amplifier control circuit 110 from the power supply terminal VBAT. Supply voltage is applied from the drain-voltage terminal VDD2 to elements including the low-noise amplifier control circuit 112 and the low-noise amplifiers 109 installed at the module substrate 21.

Next, a method of manufacturing the semiconductor device 22(FIG. 4) will be described with reference to drawings in FIGS. 6A to 7C. The drawings in FIGS. 6A to 7B provide schematic sectional views of the semiconductor device 22 during a manufacturing process. FIG. 7C provides a schematic sectional view of the finished semiconductor device 22.

Figure 6A:
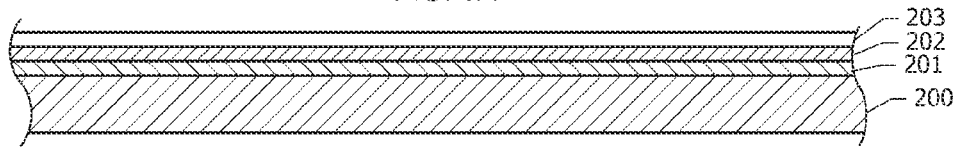
FIGS. 6A to 6F provide schematic sectional views of the semiconductor device during a manufacturing process.

As illustrated in FIG. 6A, a release layer 201 is epitaxially grown on a single-crystal base substrate 200 made from a compound semiconductor such as GaAs, and an element formation layer 202 is formed on the release layer 201. Element structures including the semiconductor element 45, the emitter electrode 46E, the collector electrode 46C, the base electrode 46B, the emitter wire 47E, the collector wire 47C, and the second-layer emitter wire 48E, which are illustrated in FIG. 3, are formed at the element formation layer 202. These element structures are formed in accordance with a general semiconductor manufacturing process. FIG. 6A does not illustrate the element structures formed at the element formation layer 202. In this stage, an element structure corresponding to a plurality of second members 40 (FIG. 2A) is formed at the element formation layer 202, so that the individual second members 40 are not yet separated from each other. An insulating protection film 203 is formed on the element formation layer 202.

Figure 6B:
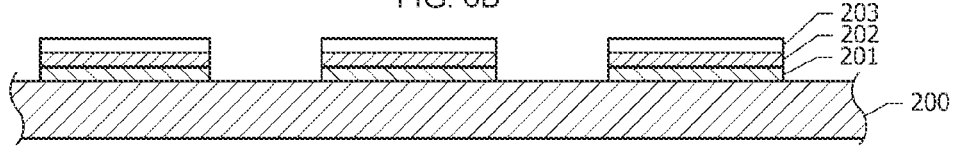

Next, as illustrated in FIG. 6B, the protection film 203, the element formation layer 202, and the release layer 201 are subjected to patterning by using a resist pattern (not illustrated in the drawing) as an etch mask. In this stage, the element formation layer 202 is divided into the individual second members 40 (FIG. 2A).

Figure 6C:
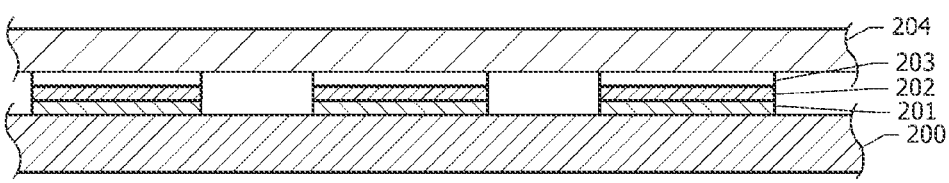

Next, as illustrated in FIG. 6C, a connecting support 204 is bonded on the divided protection films 203. As a result, the plurality of protection films 203 are connected to each other by the connecting support 204. The resist pattern used as an etch mask in the patterning step of FIG. 6B may be left so that the resist pattern exists between the protection film 203 and the connecting support 204.

Figure 6D:
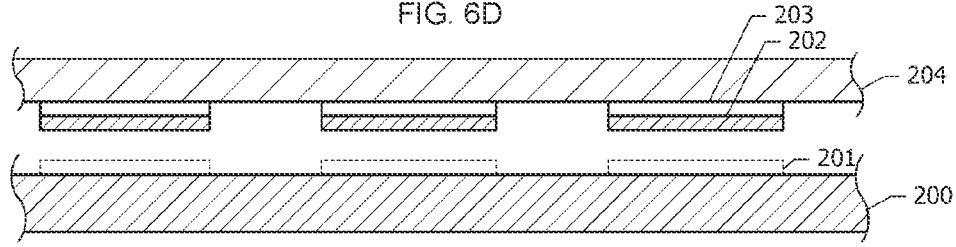

Next, as illustrated in FIG. 6D, the release layer 201 corresponding to the base substrate 200 and the element formation layer 202 is selectively etched. As a result, the element formation layer 202, the protection film 203, and the connecting support 204 are released from the base substrate 200. To selectively etch the release layer 201, the release layer 201 is formed from a compound semiconductor having an etch resistance different from both the etch resistance of the base substrate 200 and the etch resistance of the element formation layer 202.

Figure 6E:
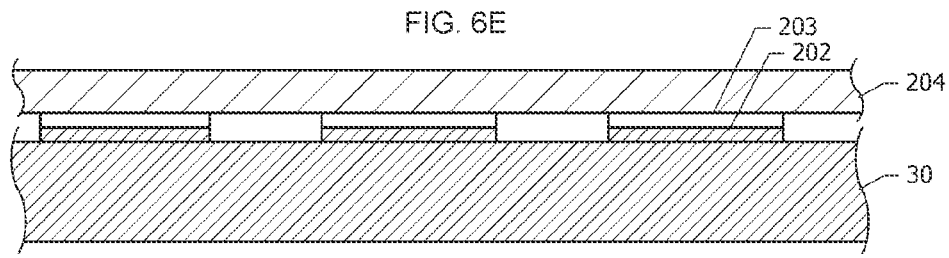

Next, as illustrated in FIG. 6E, the element formation layer 202 is joined to the first member 30. In this stage, the first member 30 is not divided into individual pieces illustrated in FIGS. 2A and 2B, and one wafer includes a plurality of first members 30. FIG. 6E does not illustrate the structure of the first electronic circuit 39 and the multilayer wiring structure 34 formed at the first member 30, which are illustrated in FIG. 4.

The element formation layer 202 and the first member 30 are joined to each other by the Van der Waals force or hydrogen bonding. The element formation layer 202 may be joined to the first member 30 by, for example, static electricity, covalent bonding, or eutectic alloy bonding. For example, the element formation layer 202 and the first member 30 may be joined to each other by forming an Au film at an area of a surface of the first member 30 and apply pressure in the state in which the element formation layer 202 is in close contact with the Au film.

Figure 6F:
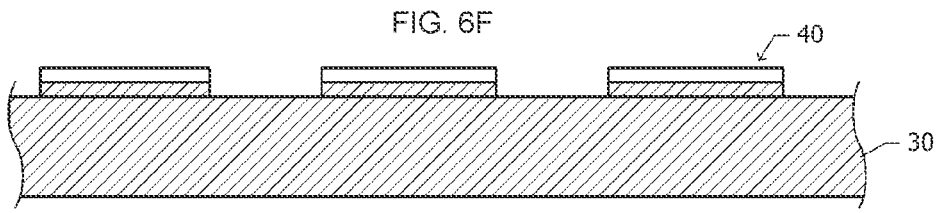

Next, as illustrated in FIG. 6F, the connecting support 204 is released from the protection film 203. After these steps, a structure is obtained in which the individual second members 40 are joined on the wafer including a plurality of first members 30.

Figure 7A:
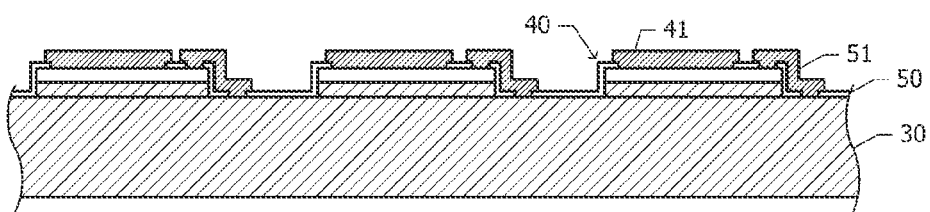
FIGS. 7A and 7B provide schematic sectional views of the semiconductor device during a manufacturing process.

After releasing the connecting support 204, as illustrated in FIG. 7A, an interlayer insulating film 50 and the redistribution layer are formed over the first member 30 and the second member 40. The redistribution layer includes, for example, the pads 41 disposed on the second member 40 and the inter-member connection wire 51 (FIG. 4) extending from the top of the second member 40 across the edges of the second member 40 to the top of the first member 30. The redistribution layer includes the pads 31 (FIG. 4) disposed on the first member 30, but the pads 31 are not illustrated in FIG. 7A.

Figure 7B:
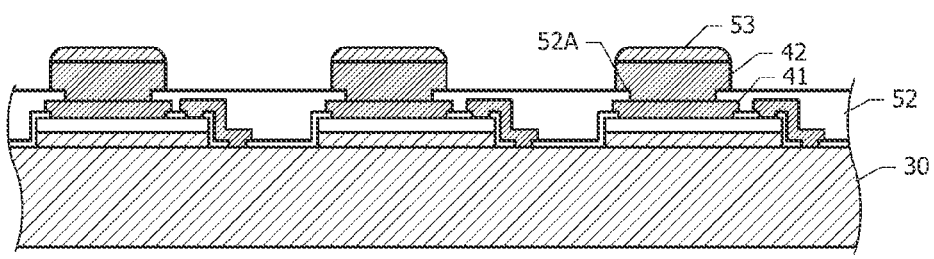
Figure 7C:
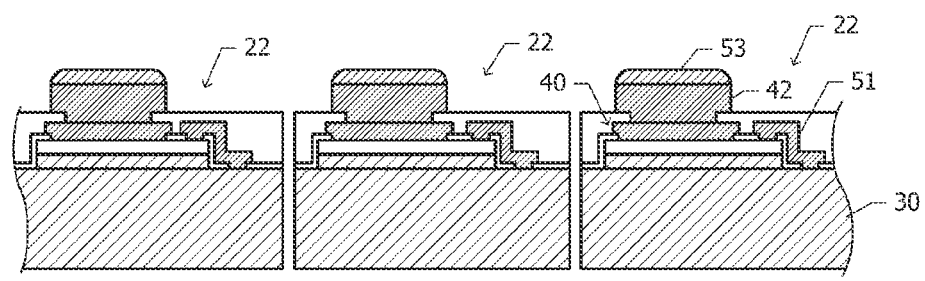
FIG. 7C provides a schematic sectional view of the finished semiconductor device.

Next, as illustrated in FIG. 7B, the protection film 52 is formed on redistribution layer, and the plurality of openings 52A are formed at the protection film 52. The pads 41 and 31 (FIG. 4) include the plurality of openings 52A in plan view. The second conductive raised portions 42 and the first conductive raised portions 32 (FIG. 4) are formed in the openings 52A and on the protection film 52. The reflow process is performed in the state in which the solder joints 53 are laid on top surfaces of the first conductive raised portion 32 and top surfaces of the second conductive raised portions 42.

Finally, as illustrated in FIG. 7C, the wafer including the plurality of first members 30 are cut with a dicing machine. This yields the semiconductor device 22 as an individual piece including, for example, the first member 30, the second member 40, the redistribution layer thereon, and the second conductive raised portions 42 and the first conductive raised portions 32 (FIG. 4).

Figure 8:
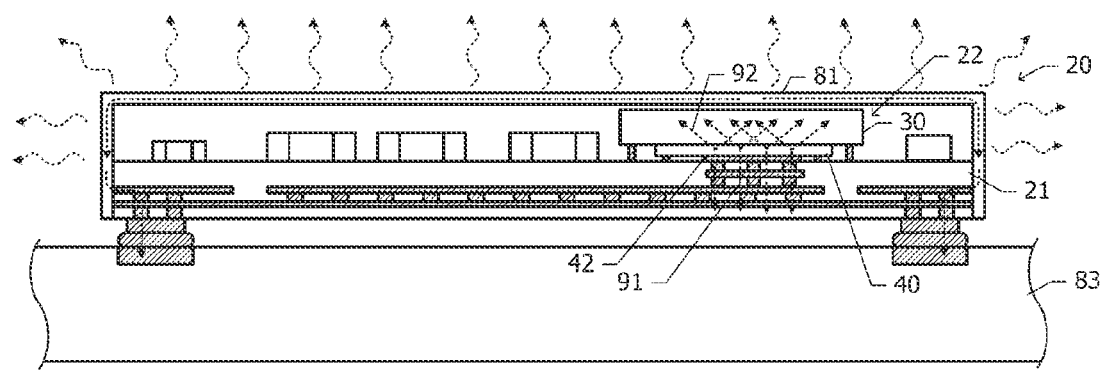
FIG. 8 is a sectional view in the state in which the radio-frequency module including the semiconductor device according to the first embodiment is mounted on a motherboard.

Next, advantageous effects of the first embodiment will be described with reference to FIG. 8. FIG. 8 is a sectional view in the state in which the radio-frequency module 20 including the semiconductor device 22 according to the first embodiment is mounted on the motherboard 83. A first heat transfer path 91 and a second heat transfer path 92 are formed. Heat generated at the semiconductor element 45 (FIG. 2B) of the second member 40 is transferred along the first heat transfer path 91 through the second conductive raised portion 42 (FIG. 2B) to the module substrate 21 or along the second heat transfer path 92 through a joint surface between the first member 30 and the second member 40 to the first member 30.

The heat transferred to the first member 30 diffuses in the first member 30. Usually, the thermal conductivity of a main material of the substrate 33 at which the silicon-based semiconductor element 35 (FIG. 4) is formed is higher than the thermal conductivity of a main material of the second member 40 at which the compound semiconductor element 45 is formed. Hence, heat transferred to the first member 30 is easy to diffuse in the first member 30. The heat diffusing in the first member 30 is transferred through the sealing material 80 to the metal film 81. The heat diffusing in the first member 30 is transferred mainly from the top surface of the first member 30 to the metal film 81 over the first member 30.

The thermal conductivity of the metal film 81 is higher than the thermal conductivity of the sealing material 80 usually made from, for example, a resin. Hence, the heat transferred to the metal film 81 along the second heat transfer path 92 is subsequently transferred through the metal film 81 covering the top surface of the sealing material 80 to the metal film 81 covering the sealing material 80 and the side surfaces of the module substrate 21. Because heat is released from almost the entire part of the metal film 81, this structure can achieve higher efficiency of releasing heat transferred to the metal film 81 along the second heat transfer path 92.

As described above, the heat generated at the semiconductor elements 45 of the second member 40 is released through both the first heat transfer path 91, which is elongated downwards when viewed from the second member 40, and the second heat transfer path 92, which is elongated upwards. Consequently, it is possible to suppress rises in temperature of the semiconductor elements 45.

The electron mobility in compound semiconductors such as GaAs is greater the electron mobility in silicon. Because the power amplifier 104 is constituted by the semiconductor elements 45 formed by a compound semiconductor layer epitaxially grown on the semiconductor thin film 44 (FIG. 3) formed from a compound semiconductor, it is possible to increase the operating frequency of the power amplifier 104.

In the first embodiment, the second member 40 is released from the base substrate 200 (FIG. 6D) for epitaxial growth and then bonded to the first member 30, and as a result, the second member 40 can be thinner than if the second member 40 is bonded together with the base substrate 200 to the first member 30. For example, the second member 40 released from the base substrate 200 is only several μm. Because the second member 40 is sufficiently thin, the redistribution layer can be formed on both the lower surface of the first member 30 and the lower surface of the second member 40 in the state in which the second member 40 is bonded to the first member 30 by employing a semiconductor manufacturing process. This can achieve thinner wiring and lower costs when compared to the structure in which the first electronic circuit 39 included in the first member 30 and the second electronic circuit 49 included in the second member 40 are connected to each other by wire bonding.

When a monolithic microwave integrated circuit (MMIC) including the second electronic circuit 49 (FIG. 4) and the first member 30 including the first electronic circuit 39 (FIG. 4) are mounted at different positions of the module substrate, it is necessary to connect the first electronic circuit 39 and the second electronic circuit 49 to each other by a wire on the module substrate. Because in the first embodiment the first electronic circuit 39 and the second electronic circuit 49 are connected to each other by the inter-member connection wire 51 (FIG. 4) disposed at the redistribution layer, the wire connecting both circuits can be shortened. This can reduce transmission loss of radio-frequency signals. Moreover, the radio-frequency module 20 can be downsized.

Figure 9:
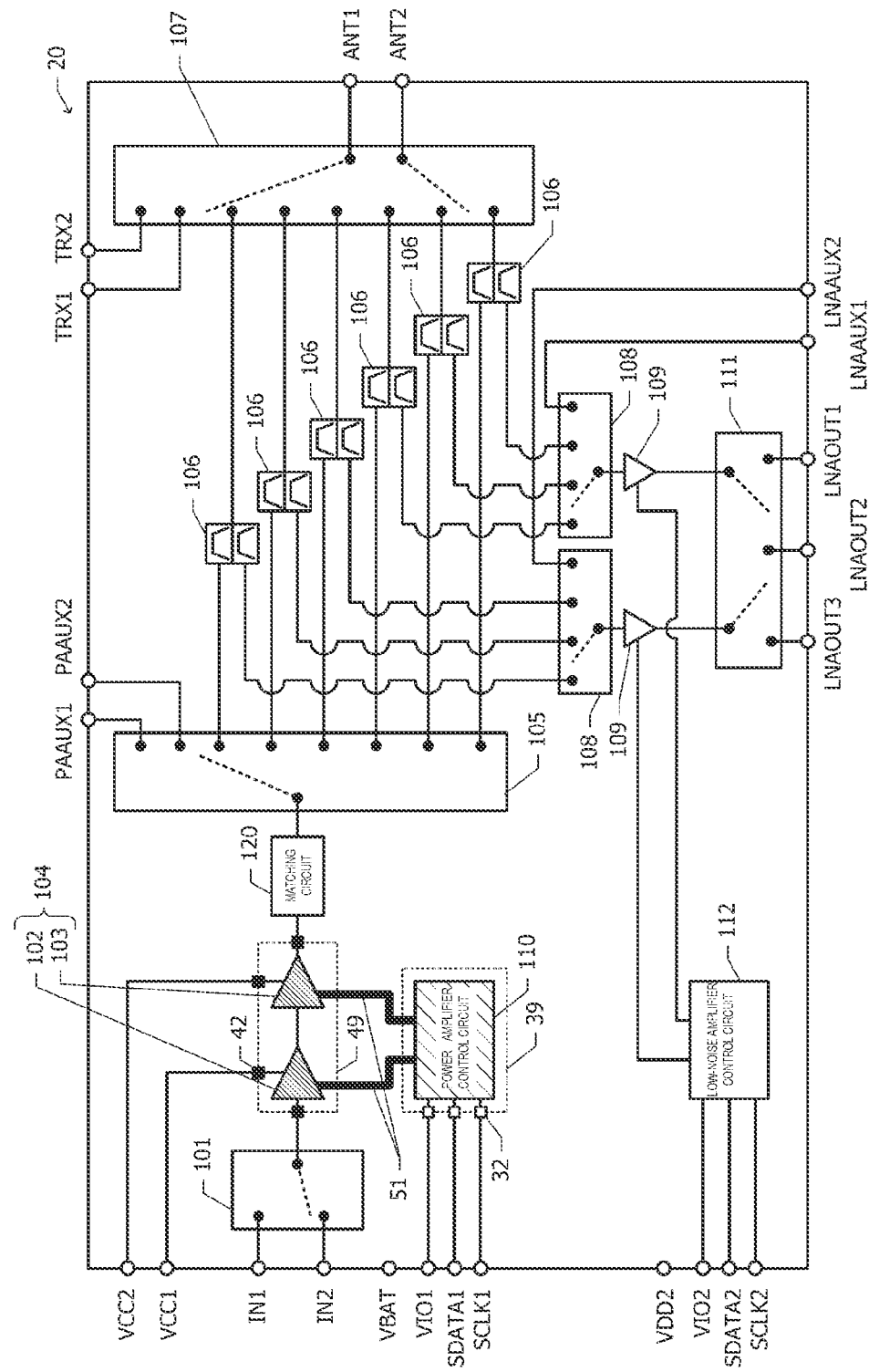
FIG. 9 is a block diagram illustrating a circuit configuration of a radio-frequency module including a semiconductor device according to a modification to the first embodiment.
Figure 10:
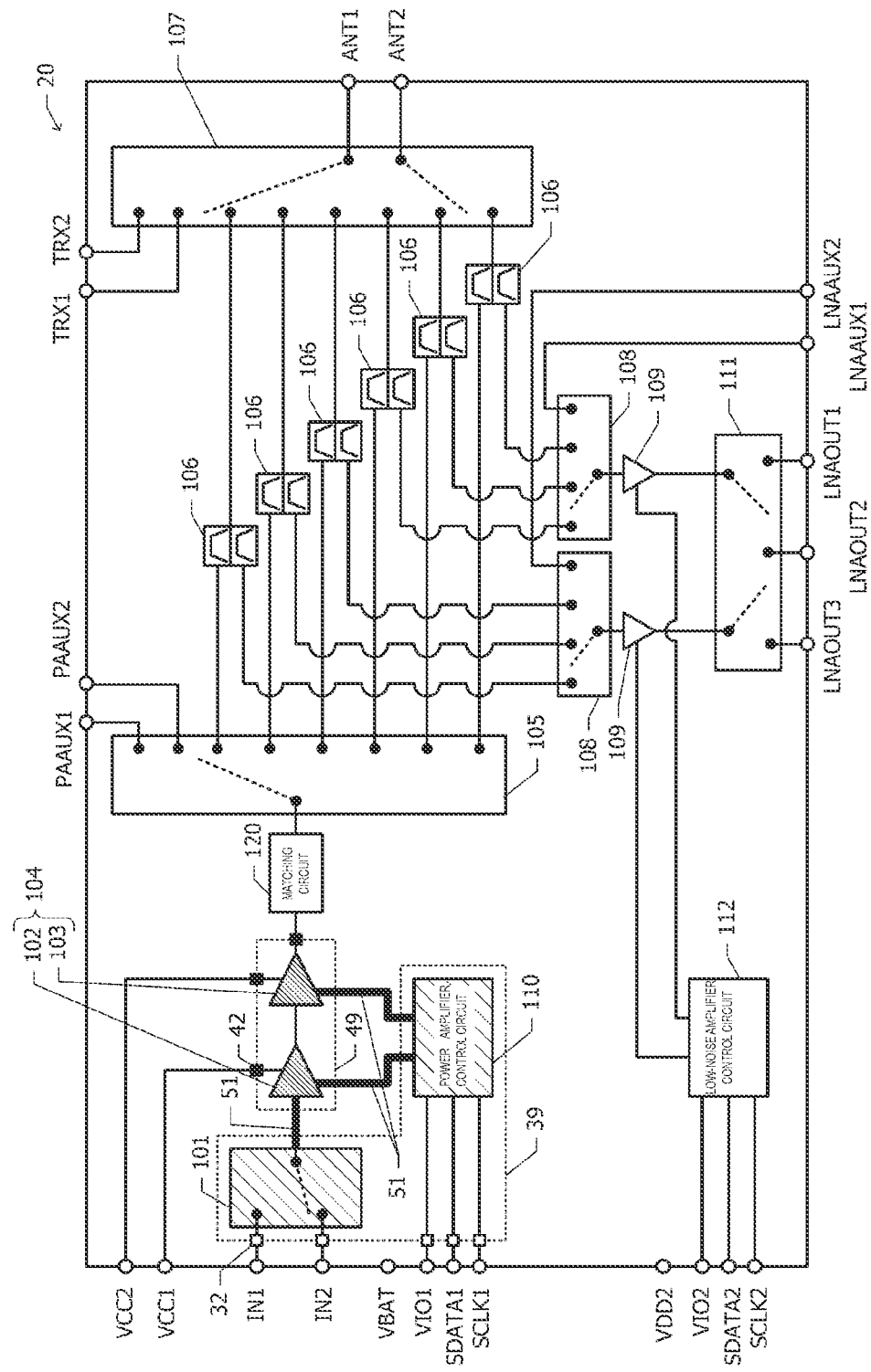
FIG. 10 is a block diagram illustrating a circuit configuration of a radio-frequency module including a semiconductor device according to another modification to the first embodiment.

Next, modifications to the first embodiment will be described with reference to FIGS. 9 and 10. FIGS. 9 and 10 are block diagrams illustrating circuit configurations of the radio-frequency module 20 including the semiconductor device 22 according to two modifications to the first embodiment.

In the first embodiment (FIG. 5), the first electronic circuit 39 (FIG. 4) of the first member 30 includes the input switch 101, the band selection switch 105, and the power amplifier control circuit 110. By contrast, in the modification illustrated in FIG. 9, the first electronic circuit 39 includes only the power amplifier control circuit 110, and the input switch 101 and the band selection switch 105 are mounted at the module substrate 21 (FIG. 2A) separately from the semiconductor device 22.

The input switch 101 and the first-stage amplifier circuit 102 are coupled to each other via the second conductive raised portion 42 provided at the second member 40. The transmit-side matching circuit 120 and the band selection switch 105 are coupled to each other via a wire in the module substrate 21 (FIG. 2A).

In the modification illustrated in FIG. 10, the first electronic circuit 39 of the first member 30 (FIG. 4) includes the input switch 101 and the power amplifier control circuit 110, the band selection switch 105 is mounted at the module substrate 21 (FIG. 2A) separately from the semiconductor device 22. The second-stage amplifier circuit 103 and the transmit-side matching circuit 120 are coupled to each other via a wire in the module substrate 21 (FIG. 2A) in the same manner as the modification illustrated in FIG. 9.

Next, other modifications to the first embodiment will be described. Although the radio-frequency module 20 including the semiconductor device 22 according to the first embodiment includes six duplexers 106 (FIG. 5), the number of the duplexers 106 is not limited to six, and any number of duplexers 106 may be included. The number of receive-signal output terminals, such as the receive-signal output terminals LNAOUT1, LNAOUT2, and LNAOUT3 (FIG. 5) is not limited to three. The number of antenna terminals, such as the antenna terminals ANT1 and ANT2, is not limited to two. Any of the auxiliary output terminals PAAUX1 and PAAUX2, the transmit-signal input terminals TRX1 and TRX2, and the auxiliary input terminals LNAAUX1 and LNAAUX2 may be decreased or increased in number.

As in the modifications illustrated in FIGS. 9 and 10, at least one of the input switch 101 and the band selection switch 105 may be mounted at the module substrate 21 separately from the semiconductor device 22. The first electronic circuit 39 may include at least one of the antenna switch 107, the band selection switches 108 for received signals, the low-noise amplifiers 109, the output-terminal selection switch 111, and the low-noise amplifier control circuit 112.

Although in the first embodiment the semiconductor thin film 44 (FIG. 3) of the second member 40 is formed from GaAs, another compound semiconductor may be used. Examples of compound semiconductors used to form the semiconductor thin film 44 include AlAs, InAs, InP, GaP, InSb, GaN, InN, AlN, SiGe, SiC, $Ga_2O_3$, GaBi, or mixed-crystal semiconductor materials containing elements of these compound semiconductors. Although in the first embodiment a silicon semiconductor element is used as the semiconductor element 35 (FIG. 4) formed at the first member 30, other elemental semiconductor elements such as a germanium semiconductor element may be used.

In the first embodiment, for example, the first conductive raised portion 32 and the solder joint 53 thereon and the second conductive raised portion 42 and the solder joint 53 thereon are used as electrodes for mounting the semiconductor device 22 on the module substrate 21, but other various conductive raised portions may be used. For example, pillars, posts, or ball bumps made from a conductor may be used as conductive raised portions for external connection.

Second Embodiment

Next, a semiconductor device according to a second embodiment will be described with reference to FIG. 11. The following description does not repeat configurations common to the semiconductor device according to the first embodiment described with reference to FIGS. 1 to 8.

Figure 11:
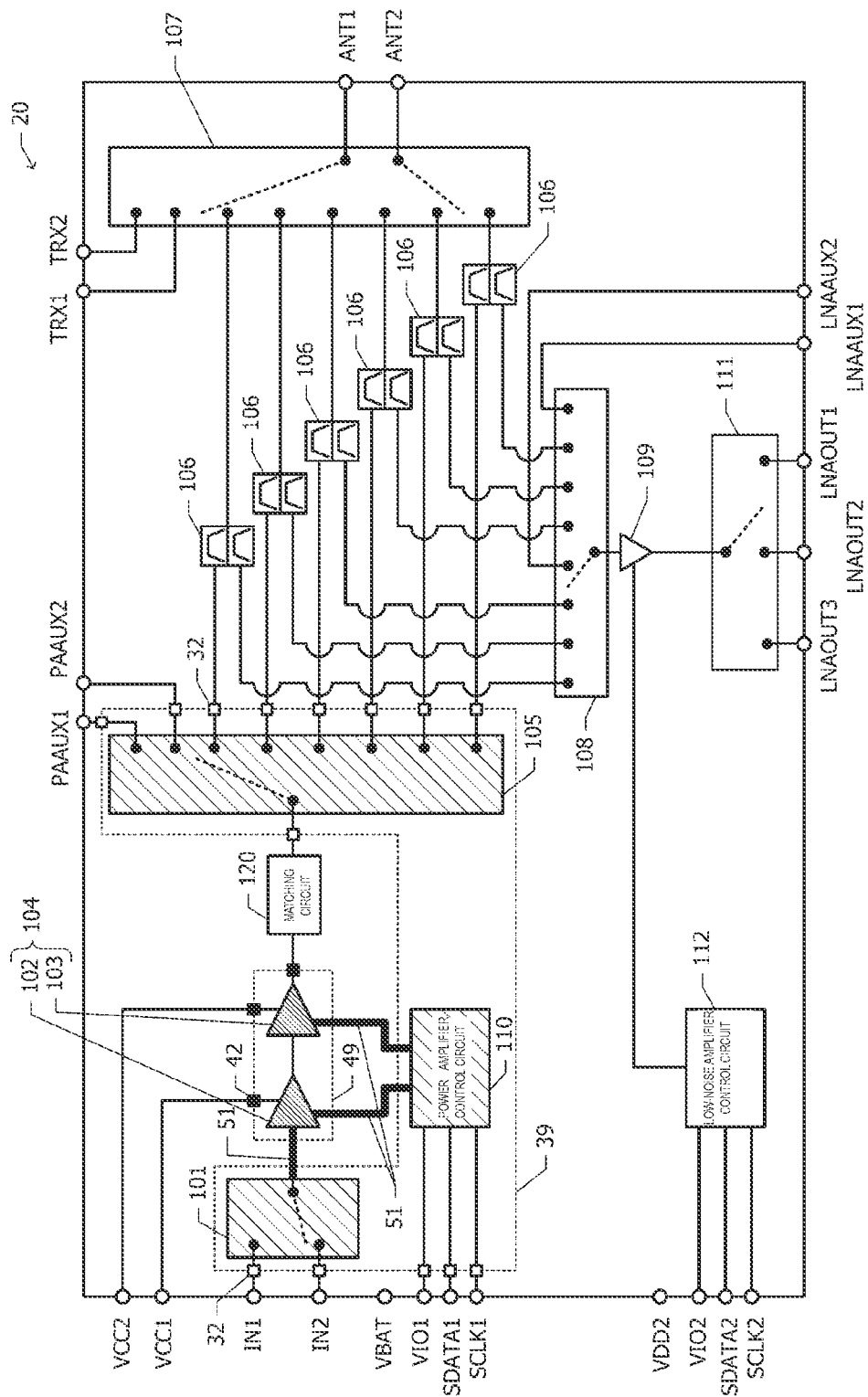
FIG. 11 is a block diagram illustrating a circuit configuration of a radio-frequency module including a semiconductor device according to a second embodiment.

FIG. 11 is a block diagram illustrating a circuit configuration of the radio-frequency module 20 including the semiconductor device 22 (FIG. 4) according to the second embodiment. In the first embodiment, the two band selection switches 108 for received signals and the two low-noise amplifiers 109 (FIG. 5) are mounted at the module substrate 21. By contrast, in the second embodiment, a single band selection switch 108 for received signals and a single low-noise amplifier 109 are mounted at the module substrate 21.

The band selection switch 108 includes eight contacts on the input side. Six contacts out of the eight contacts are individually coupled to output ports for received signals of six duplexers 106. The other two contacts are coupled to the auxiliary input terminals LNAAUX1 and LNAAUX2. The band selection switch 108 causes a receive signal inputted to one contact selected from the eight input-side contacts to be inputted to the low-noise amplifier 109.

A circuit-side contact of the output-terminal selection switch 111 is coupled to the low-noise amplifier 109. A receive signal amplified by the low-noise amplifiers 109 is outputted from one terminal selected by the output-terminal selection switch 111 from the three receive-signal output terminals LNAOUT1, LNAOUT2, and LNAOUT3.

Next, advantageous effects of the second embodiment will be described. Similarly to the first embodiment, the second embodiment can improve the characteristic of heat released from the semiconductor elements 45 (FIG. 4) of the second member 40 and downsize the radio-frequency module 20. The radio-frequency module 20 according to the first embodiment can simultaneously process receive signals in two bands. But when simultaneously processing receive signals in two bands is unnecessary, the configuration of the second embodiment can be utilized.

Third Embodiment

Next, a semiconductor device according to a third embodiment will be described with reference to FIG. 12. The following description does not repeat configurations common to the semiconductor device according to the first embodiment described with reference to FIGS. 1 to 8.

Figure 12:
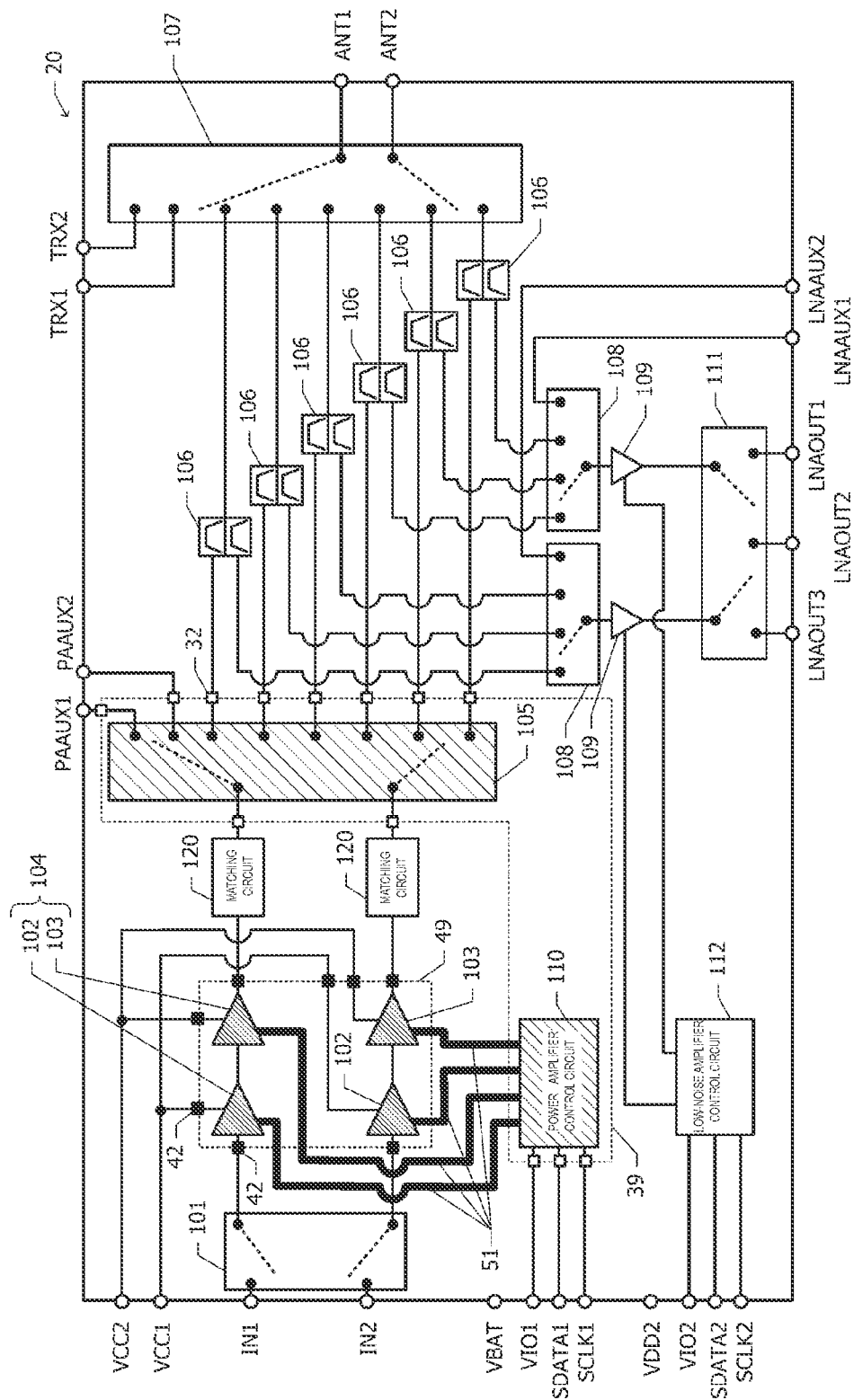
FIG. 12 is a block diagram illustrating a circuit configuration of a radio-frequency module including a semiconductor device according to a third embodiment.

FIG. 12 is a block diagram illustrating a circuit configuration of the radio-frequency module 20 including the semiconductor device according to the third embodiment. In the first embodiment, the second electronic circuit 49 (FIG. 4) of the second member 40 includes a single power amplifier 104 (FIG. 5). By contrast, in the third embodiment, the second electronic circuit 49 (FIG. 9) includes two power amplifiers 104. The power amplifiers 104 each include the first-stage amplifier circuit 102 and the second-stage amplifier circuit 103.

Although in the first embodiment the first electronic circuit 39 (FIG. 4) of the first member 30 includes the input switch 101 (FIG. 5), in the third embodiment the input switch 101 is mounted at the module substrate 21 separately from the semiconductor device 22 (FIG. 2A).

The input switch 101 includes two contacts on the circuit side. The two circuit-side contacts are individually coupled to the two first-stage amplifier circuits 102 via the second conductive raised portions 42 provided at the second member 40. The input switch 101 controls connection and disconnection between the two radio-frequency-signal input terminals IN1 and IN2 and the two first-stage amplifier circuits 102. Specifically, a radio-frequency signal inputted to the one radio-frequency-signal input terminal IN1 is inputted to one first-stage amplifier circuit 102, whereas a radio-frequency signal inputted to the other radio-frequency-signal input terminal IN2 is inputted to the other first-stage amplifier circuit 102.

The band selection switch 105 for transmitting signals includes two contacts on the input side. The two input-side contacts are coupled to the two second-stage amplifier circuits 103 via the two transmit-side matching circuits 120. The band selection switch 105 connects one contact of the input-side contacts to one contact of a plurality of output-side contacts and the other contact of the input-side contacts to another contact of the plurality of output-side contacts.

Power is supplied from the power supply terminal VCC1 to the two first-stage amplifier circuits 102 and from the power supply terminal VCC2 to the two second-stage amplifier circuits 103. The power amplifier control circuit 110 controls the two power amplifiers 104.

Next, advantageous effects of the third embodiment will be described. Similarly to the first embodiment, the third embodiment can improve the characteristic of heat released from the semiconductor elements 45 (FIG. 4) of the second member 40 and downsize the radio-frequency module 20. Moreover, the third embodiment can implement carrier aggregation of simultaneously transmitting radio-frequency signals in two bands.

Next, a modification to the third embodiment will be described. In the third embodiment the input switch 101 is mounted at the module substrate 21 (FIG. 2A) separately from the semiconductor device 22 (FIG. 2A), but the first electronic circuit 39 of the first member 30 (FIG. 4) may include the input switch 101 in the same manner as the first embodiment.

Fourth Embodiment

Next, a semiconductor device according to a fourth embodiment will be described with reference to FIG. 13. The following description does not repeat configurations common to the semiconductor device according to the first embodiment described with reference to FIGS. 1 to 8.

Figure 13:
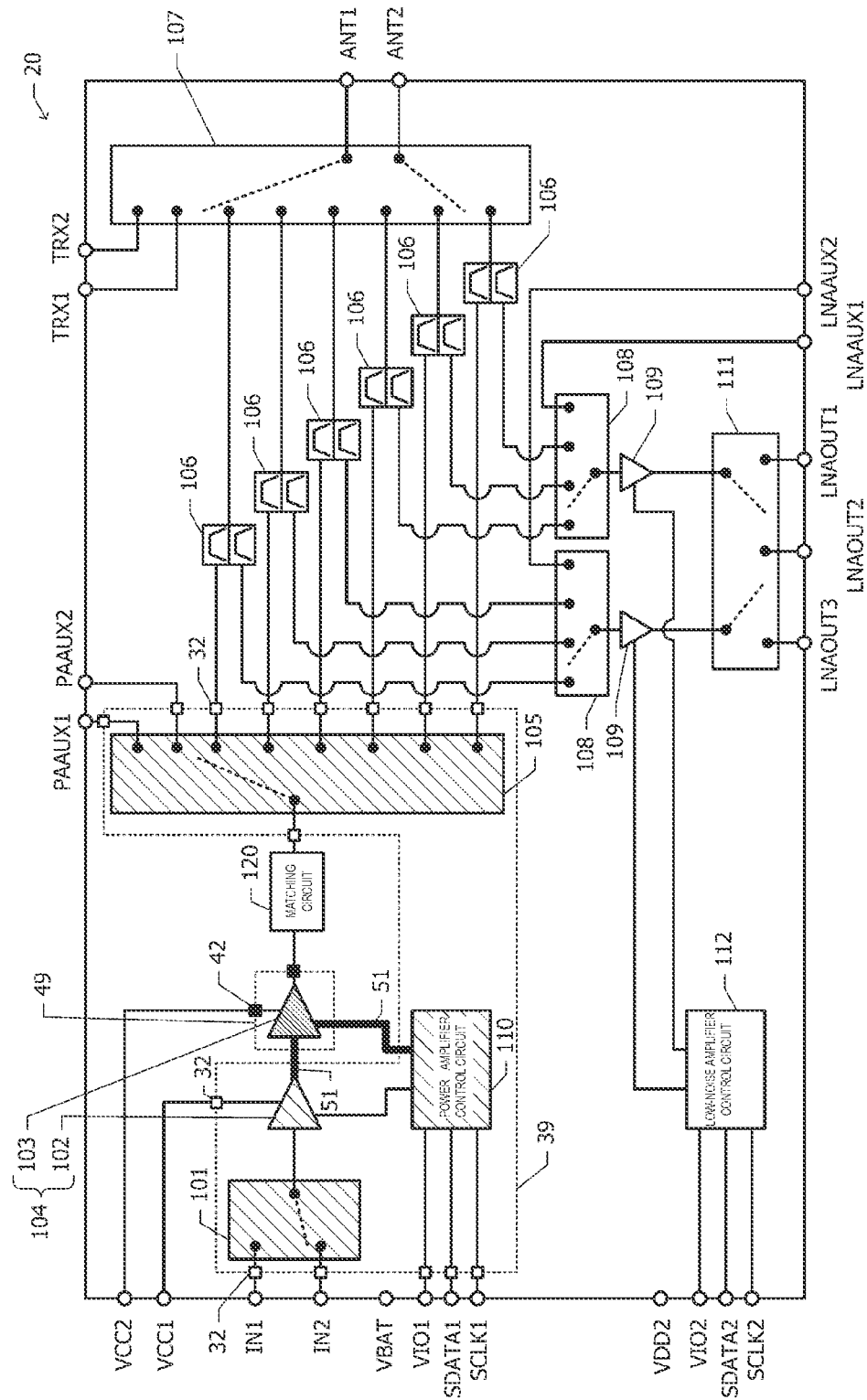
FIG. 13 is a block diagram illustrating a circuit configuration of a radio-frequency module including a semiconductor device according to a fourth embodiment.

FIG. 13 is a block diagram illustrating a circuit configuration of the radio-frequency module 20 including the semiconductor device 22 (FIG. 4) according to the fourth embodiment. In the first embodiment (FIG. 5), the second electronic circuit 49 of the second member 40 (FIG. 4) includes the first-stage amplifier circuit 102. By contrast, in the fourth embodiment, the first electronic circuit 39 of the first member 30 (FIG. 4) includes the first-stage amplifier circuit 102. An output port of the first-stage amplifier circuit 102 and an input port of the second-stage amplifier circuit 103 are coupled to each other via the inter-member connection wire 51 (FIG. 4).

Power is supplied from the power supply terminal VCC1 through the first conductive raised portion 32 (FIG. 4) provided at the first member 30 to the first-stage amplifier circuit 102. The power amplifier control circuit 110 and the first-stage amplifier circuit 102 are coupled to each other via the wire 34W (FIG. 4) disposed in the multilayer wiring structure 34 of the first member 30.

Next, advantageous effects of the fourth embodiment will be described. Similarly to the first embodiment, the fourth embodiment can improve the characteristic of heat released from the semiconductor elements 45 (FIG. 4) of the second member 40 and downsize the radio-frequency module 20. The first-stage amplifier circuit 102 outputs power lower than the output power of the second-stage amplifier circuit 103, and thus, the first-stage amplifier circuit 102 can be formed as a silicon-based semiconductor element. As a result, the first-stage amplifier circuit 102 can be included in the first electronic circuit 39 of the first member 30 (FIG. 4). By including the first-stage amplifier circuit 102 in the first electronic circuit 39, the first-stage amplifier circuit 102 matches the input switch 101 in a better manner, and as a result, the effect of improving the noise characteristic can be achieved.

Fifth Embodiment

Next, a semiconductor device according to a fifth embodiment will be described with reference to FIG. 14. The following description does not repeat configurations common to the semiconductor device according to the first embodiment described with reference to FIGS. 1 to 8.

Figure 14:
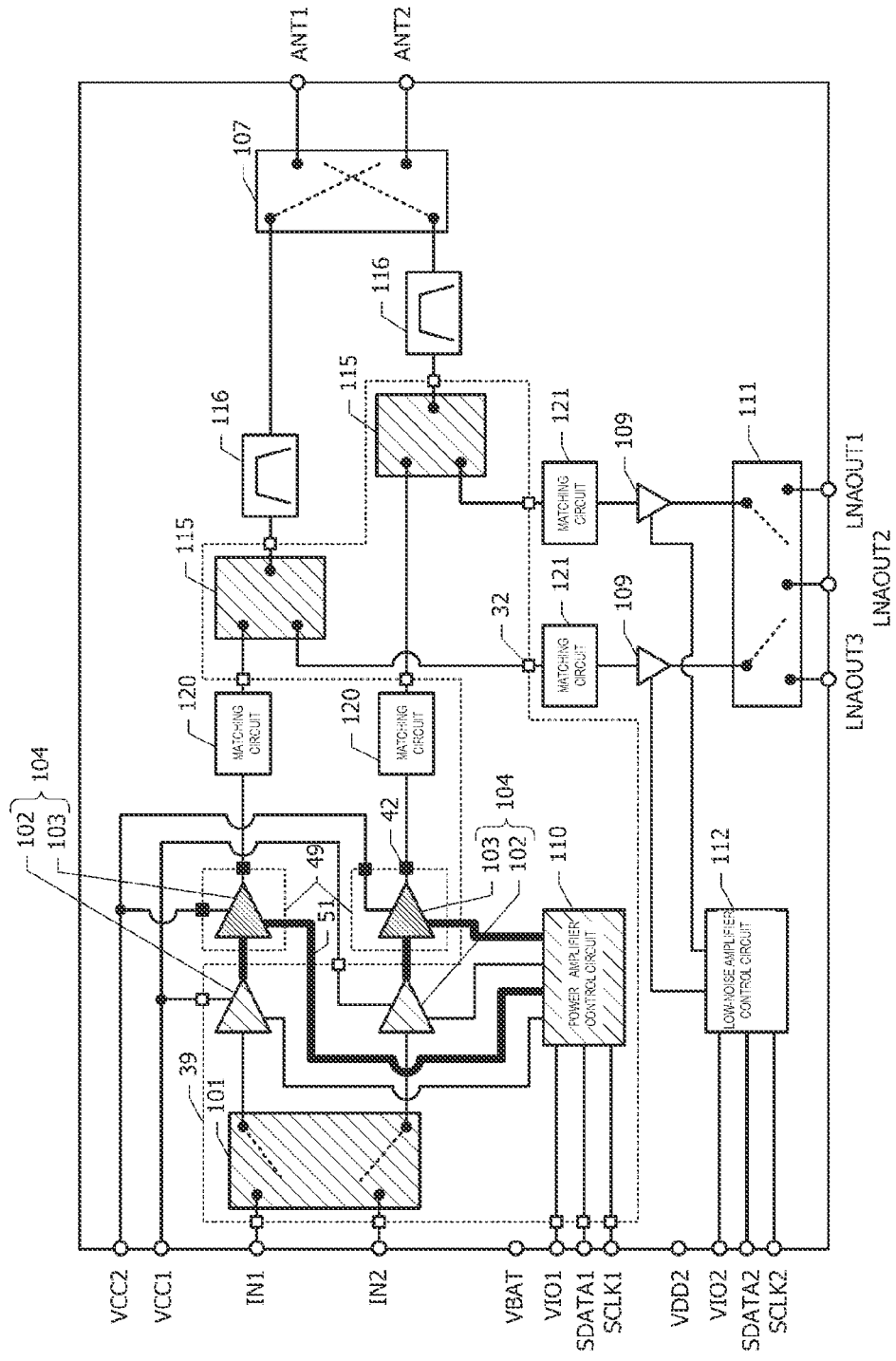
FIG. 14 is a block diagram illustrating a circuit configuration of a radio-frequency module including a semiconductor device according to a fifth embodiment.

FIG. 14 is a block diagram illustrating a circuit configuration of the radio-frequency module 20 including the semiconductor device 22 (FIG. 4) according to the fifth embodiment. The radio-frequency module 20 according to the first embodiment transmits and receives signals in accordance with an FDD system. By contrast, the radio-frequency module 20 according to the fifth embodiment transmits and receives signals in accordance with a time division duplex (TDD) system.

The radio-frequency module 20 according to the fifth embodiment includes two transceiver circuits for processing transmit and receive signals in different bands. The two transceiver circuits each include the power amplifier 104, the transmit-side matching circuit 120, a transmit and receive switch (third switch) 115, a band pass filter 116, a receive-side matching circuit 121, and the low-noise amplifier 109. Each of the power amplifiers 104 has two stages composed of the first-stage amplifier circuit 102 and the second-stage amplifier circuit 103.

Two input-side contacts of the input switch 101 are respectively coupled to the two radio-frequency-signal input terminals IN1 and IN2. Two output-side contacts of the input switch 101 are respectively coupled to input ports of the two first-stage amplifier circuits 102. The input switch 101 controls connection and disconnection between the two radio-frequency-signal input terminals IN1 and IN2 and the two first-stage amplifier circuits 102.

An output port of the second-stage amplifier circuit 103 is coupled to a transmit-signal input contact of the transmit and receive switch 115 via the transmit-side matching circuit 120. A receive-signal output contact of the transmit and receive switch 115 is coupled to an input port of the low-noise amplifier 109 via the receive-side matching circuit 121. The transmit and receive switch 115 further includes a transmit and receive common contact. The transmit and receive switch 115 switches between transmitting and receiving signals by selectively connecting the transmit and receive common contact to the transmit-signal input contact or the receive-signal output contact.

The transmit and receive common contacts of the two transmit and receive switches 115 are respectively coupled to two circuit-side contacts of the antenna switch 107 via the band pass filters 116. Two antenna-side contacts of the antenna switch 107 are respectively coupled to the antenna terminals ANT1 and ANT2.

The configuration of the output-terminal selection switch 111 coupling the two low-noise amplifiers 109 and the three receive-signal output terminals LNAOUT1, LNAOUT2, and LNAOUT3 is identical to the configuration of the output-terminal selection switch 111 (FIG. 5) of the radio-frequency module 20 according to the first embodiment.

The first electronic circuit 39 of the first member 30 (FIG. 4) includes the input switch 101, the two first-stage amplifier circuits 102, the power amplifier control circuit 110, and the two transmit and receive switches 115. The second electronic circuit 49 of the second member 40 (FIG. 4) includes the two second-stage amplifier circuits 103.

The first electronic circuit 39 and the second electronic circuit 49 are coupled to each other via the inter-member connection wire 51 (FIG. 4) formed at the redistribution layer. The first electronic circuit 39 and the circuit on the module substrate 21 (FIG. 4) are coupled to each other via the first conductive raised portions 32 (FIG. 2B) provided at the first member 30. The second electronic circuit 49 and the circuit on the module substrate 21 (FIG. 4) are coupled to each other via the second conductive raised portions 42 (FIG. 2B) provided at the second member 40.

Next, advantageous effects of the fifth embodiment will be described. Similarly to the first embodiment, the fifth embodiment can improve the characteristic of heat released from the semiconductor elements 45 (FIG. 4) of the second member 40 and downsize the radio-frequency module 20.

Figure 15:
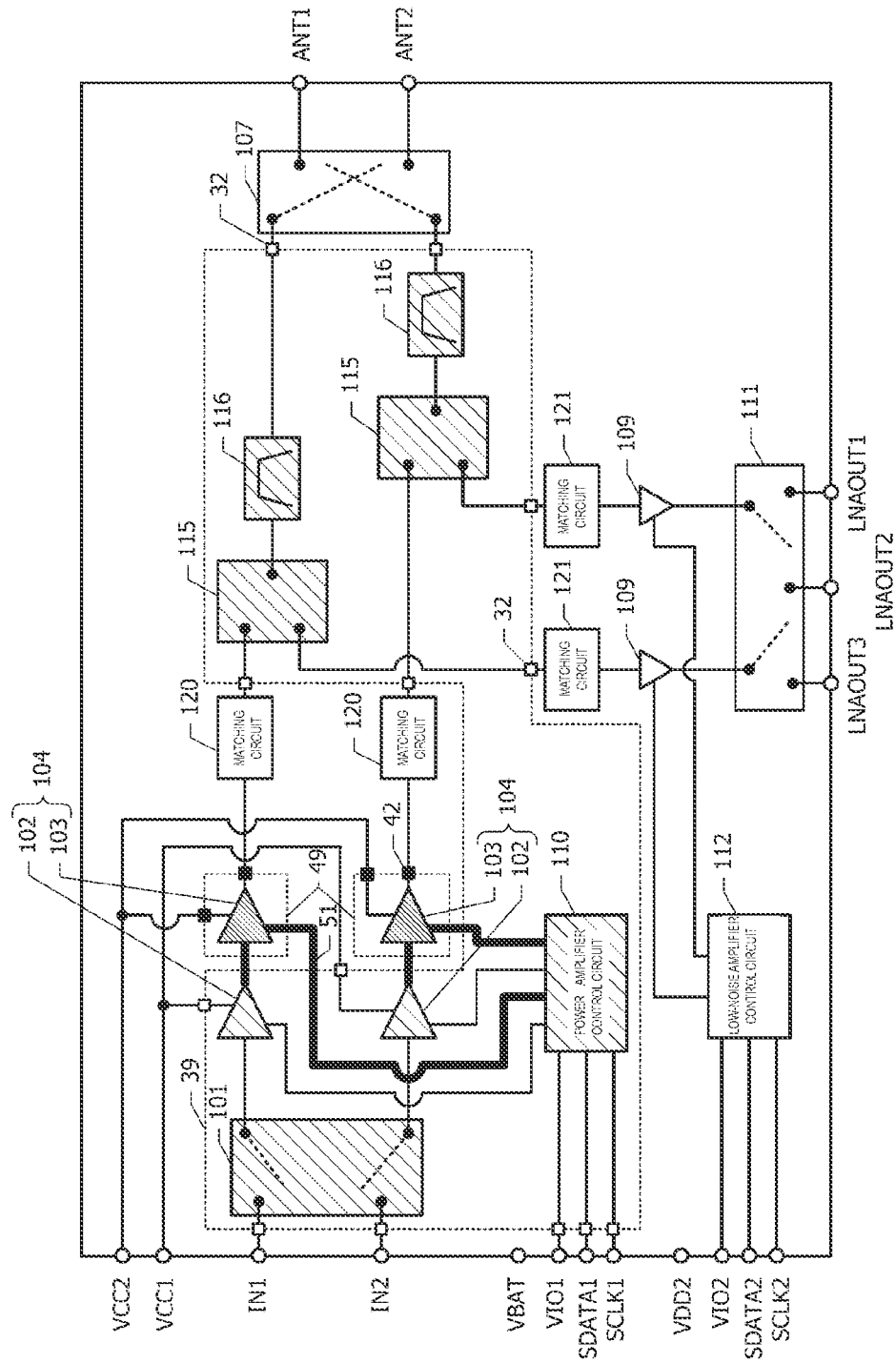
FIG. 15 is a block diagram illustrating a circuit configuration of a radio-frequency module including a semiconductor device according to a modification to the fifth embodiment.
Figure 16:
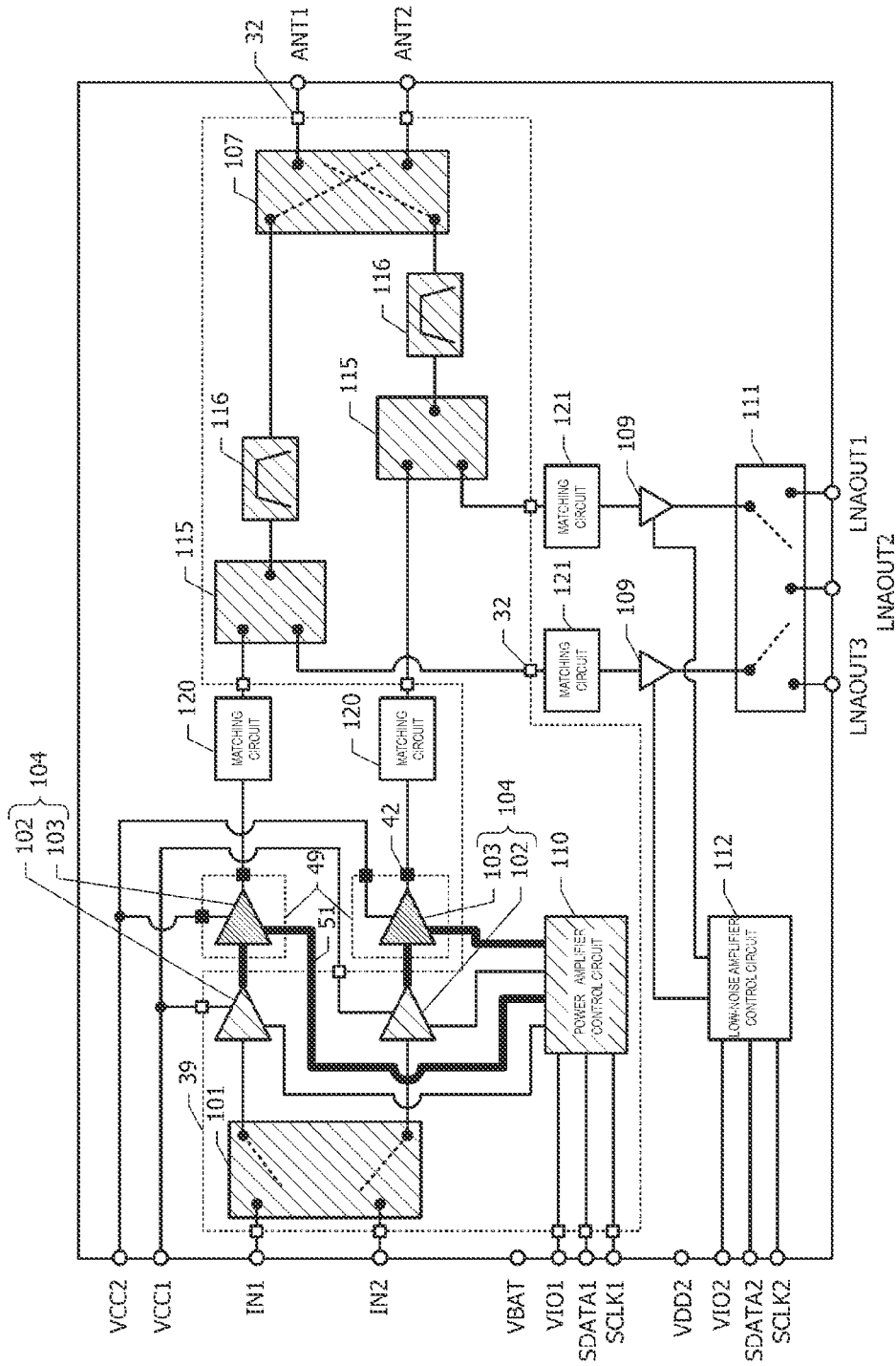
FIG. 16 is a block diagram illustrating a circuit configuration of a radio-frequency module including a semiconductor device according to another modification to the fifth embodiment.
Figure 17:
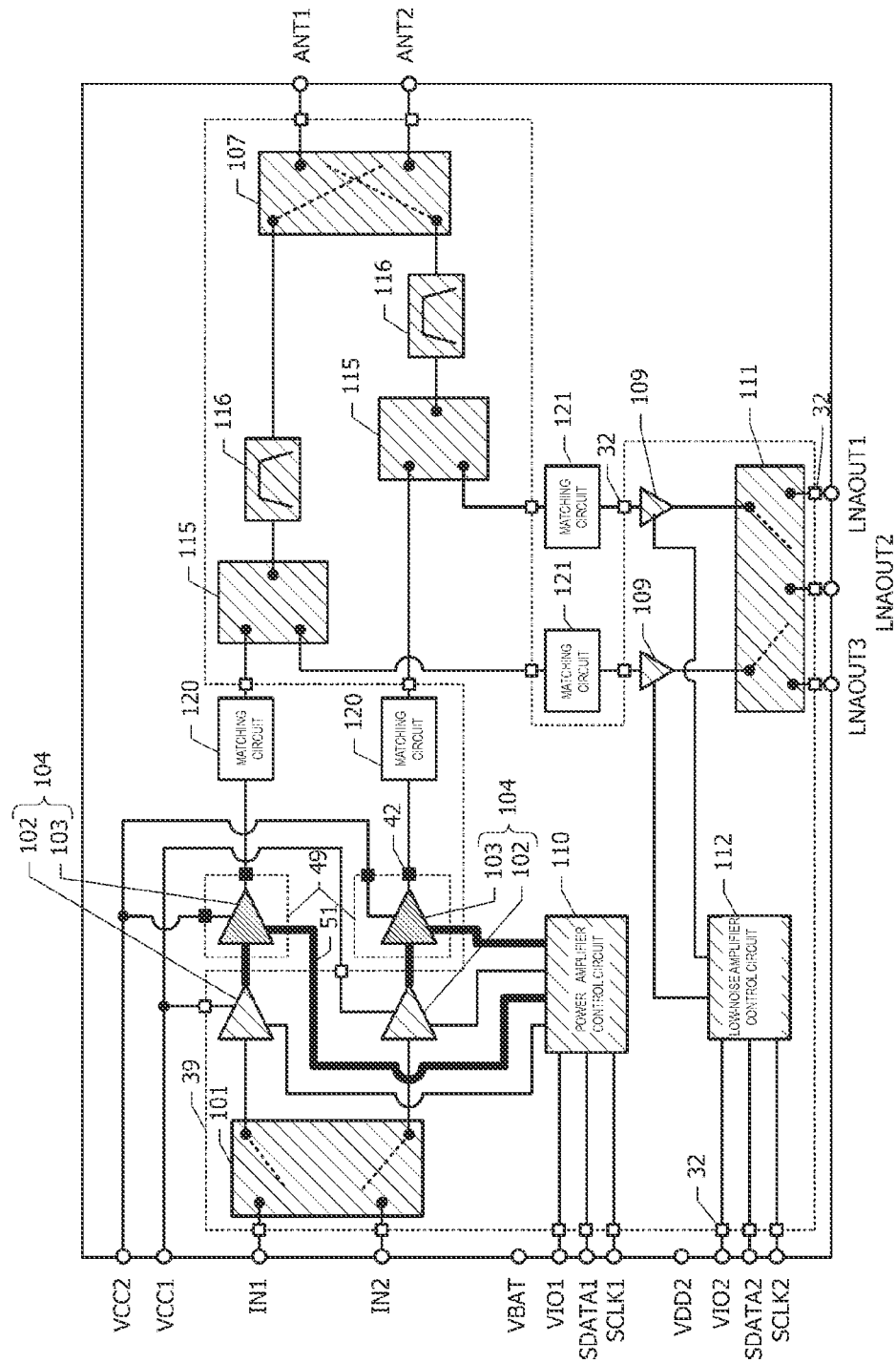
FIG. 17 is a block diagram illustrating a circuit configuration of a radio-frequency module including a semiconductor device according to a further modification to the fifth embodiment.

Next, semiconductor devices according to modifications to the fifth embodiment will be described with reference to FIGS. 15, 16, and 17. FIGS. 15, 16, and 17 are block diagrams illustrating circuit configurations of the radio-frequency module 20 including the semiconductor device 22 according to modifications to the fifth embodiment.

In the modification illustrated in FIG. 15, the first electronic circuit 39 of the first member 30 includes the two band pass filters 116 in addition to the configuration of the first electronic circuit 39 of the semiconductor device 22 according to the fifth embodiment. The band pass filters 116 are implemented by, for example, passive elements provided on the substrate 33 (FIG. 4) of the first member 30 or at an inner layer of the multilayer wiring structure 34 (FIG. 4).

The transmit and receive common contacts of the transmit and receive switches 115 and the band pass filters 116 are coupled to each other by, for example, the wires 34W in the multilayer wiring structure 34 (FIG. 4) of the first member 30. The band pass filters 116 and the circuit-side contacts of the antenna switch 107 are coupled to each other via the first conductive raised portions 32 (FIG. 2B) provided at the first member 30.

In the modification illustrated in FIG. 16, the first electronic circuit 39 of the first member 30 includes the antenna switch 107 in addition to the configuration of the first electronic circuit 39 of the semiconductor device 22 according to the modification illustrated in FIG. 15. The band pass filters 116 and the circuit-side contacts of the antenna switch 107 are coupled to each other by, for example, the wire 34W in the multilayer wiring structure 34 (FIG. 4) of the first member 30. The antenna-side contacts of the antenna switch 107 are coupled to the antenna terminals ANT1 and ANT2 via the first conductive raised portions 32 (FIG. 2B) provided at the first member 30.

In the modification illustrated in FIG. 17, the first electronic circuit 39 of the first member 30 includes the low-noise amplifier control circuit 112, the two low-noise amplifiers 109, and the output-terminal selection switch 111 in addition to the configuration of the first electronic circuit 39 of the semiconductor device 22 according to the modification illustrated in FIG. 16. The input ports of the low-noise amplifiers 109 and the receive-side matching circuits 121 are coupled to each other via the first conductive raised portions 32 (FIG. 2B) provided at the first member 30. The terminal-side contacts of the output-terminal selection switch 111 and the receive-signal output terminals LNAOUT1, LNAOUT2, and LNAOUT3 are coupled to each other via the first conductive raised portions 32 (FIG. 2B) provided at the first member 30. The low-noise amplifier control circuit 112 is coupled to the power supply terminal VIO2, the control-signal terminal SDATA2, and the clock terminal SCLK2 via the first conductive raised portions 32 (FIG. 2B) provided at the first member 30.

As in the modifications illustrated in FIGS. 15, 16, and 17, by increasing circuit components constituting the first electronic circuit 39 included in the first member 30 of the circuit components constituting the radio-frequency module 20, circuit components mounted at the module substrate 21 (FIG. 2A) can be decreased. As a result, the radio-frequency module 20 can be downsized.

Sixth Embodiment

Next, a semiconductor device according to a sixth embodiment will be described with reference to FIG. 18. The following description does not repeat configurations common to the semiconductor device according to the fifth embodiment described with reference to FIG. 14.

Figure 18:
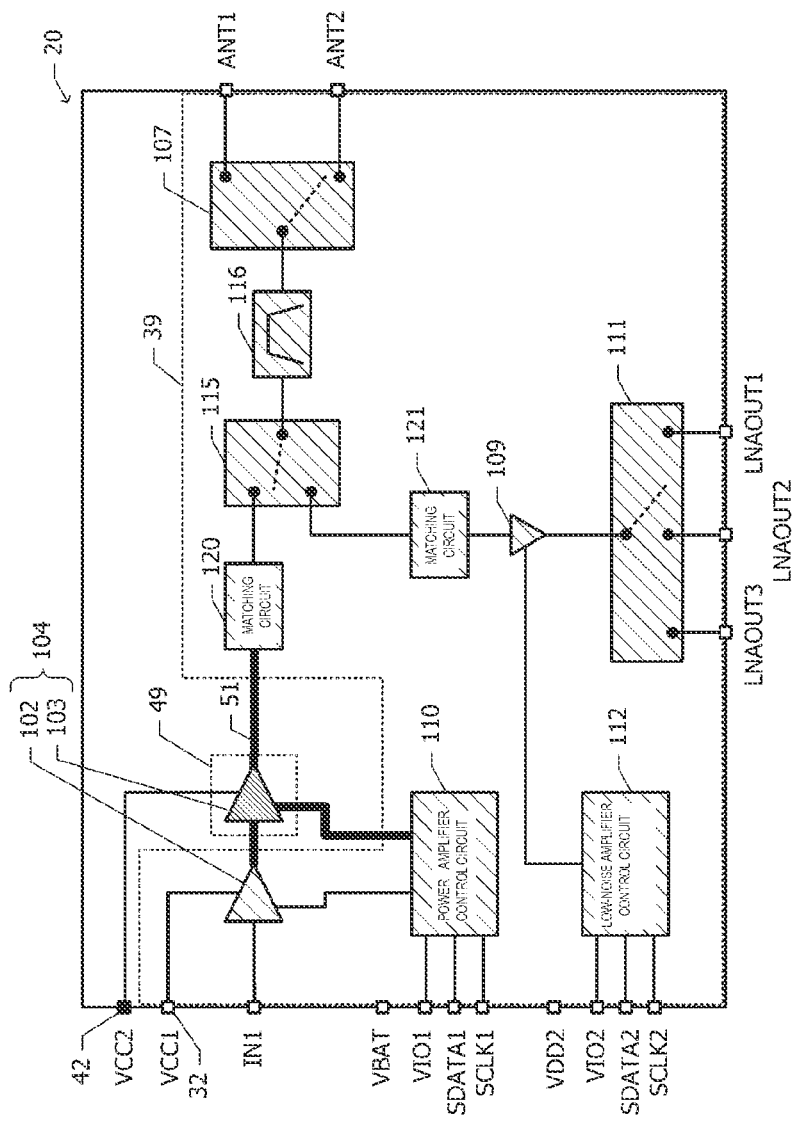
FIG. 18 is a block diagram illustrating a circuit configuration of a semiconductor device according to a sixth embodiment.

FIG. 18 is a block diagram illustrating a circuit configuration of the semiconductor device 22 (FIG. 4) according to the sixth embodiment. Although the radio-frequency module 20 including the semiconductor device 22 according to the fifth embodiment includes two transceiver circuits, the semiconductor device 22 according to the sixth embodiment includes only one transceiver circuit. Because only one transceiver circuit is included, the semiconductor device 22 according to the sixth embodiment does not include the input switch 101 (FIG. 14) included in the semiconductor device 22 according to the fifth embodiment.

The first electronic circuit 39 included in the first member 30 implements all functions except the second-stage amplifier circuit 103 of the power amplifier 104. This means that the first electronic circuit 39 includes the first-stage amplifier circuit 102, the power amplifier control circuit 110, the low-noise amplifier control circuit 112, the transmit-side matching circuit 120, the receive-side matching circuit 121, the transmit and receive switch 115, the band pass filter 116, the antenna switch 107, the low-noise amplifier 109, and the output-terminal selection switch 111. The transmit-side matching circuit 120 and the receive-side matching circuit 121 are implemented by passive elements such as capacitors and inductors.

The first conductive raised portion 32 (FIG. 2B) provided at the first member 30 serves as a terminal for connecting the first electronic circuit 39 to an external circuit different from the second electronic circuit 49 included in the second member 40 (FIG. 4). The second conductive raised portion 42 (FIG. 2B) provided at the second member 40 serves as the power supply terminal VCC2 for the second-stage amplifier circuit 103.

Next, advantageous effects of the sixth embodiment will be described. By using the semiconductor device 22 according to the sixth embodiment, the surface mount devices 23 mounted at the module substrate 21 (FIG. 2A) are unnecessary to form the radio-frequency module 20. This means that the semiconductor device 22 can implement the radio-frequency module 20. Thus, the radio-frequency module 20 can be further downsized. The semiconductor device 22 according to the sixth embodiment may be installed at the module substrate 21.

Also in the semiconductor device 22 according to the sixth embodiment, the first heat transfer path 91 (FIG. 8), along which heat generated at the semiconductor elements 45 of the second member 40 is transferred downwards through the second conductive raised portions 42, and the second heat transfer path 92 (FIG. 8), along which the heat is transferred to the first member 30, are formed. Thus, the characteristic of heat release can be improved in the same manner as the first embodiment.

Next, a modification to the sixth embodiment will be described. Although the semiconductor device 22 according to the sixth embodiment includes only one transceiver circuit, similarly to the radio-frequency module 20 (FIG. 14) including the semiconductor device 22 according to the fifth embodiment, the semiconductor device 22 according to the sixth embodiment may include two, three, or more transceiver circuits. In this case, the first electronic circuit 39 implements all functions except the second-stage amplifier circuits 103 individually included in the plurality of transceiver circuits. When a plurality of transceiver circuits are included, the first electronic circuit 39 can include the input switch 101 similarly to the semiconductor device 22 according to the fifth embodiment (FIG. 14).

The embodiments described above are mere examples, and as might be expected, the configurations described in the different embodiments may be partially replaced or combined with each other. In particular, almost identical effects and advantages achieved by almost identical configurations in the plurality of embodiments are not mentioned in every embodiment. Moreover, the present disclosure is not limited to the embodiments described above. For example, various modifications, improvements, and combinations would be apparent to those skilled in the art.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a first member including a first electronic circuit partially configured by a semiconductor element that is configured from an elemental semiconductor and that is disposed at a surface layer portion;
    at least one first conductive raised portion disposed on one surface of the first member and coupled to the first electronic circuit;
    a second member joined to the one surface of the first member on which the first conductive raised portion is disposed, the second member being smaller than the first member in plan view, and the second member including a second electronic circuit partially configured by a semiconductor element configured from a compound semiconductor;
    at least one second conductive raised portion disposed at the second member, coupled to the second electronic circuit, and raised in a direction identical to a direction in which the first conductive raised portion is raised; and
    a power amplifier including a first-stage amplifier circuit and a second-stage amplifier circuit, wherein
    the second electronic circuit includes the second-stage amplifier circuit,
    either the first electronic circuit or the second electronic circuit includes the first-stage amplifier circuit,
    the first-stage amplifier circuit is configured to amplify a radio-frequency signal and input the radio-frequency signal to the second-stage amplifier circuit, and
    the first electronic circuit includes
        a first switch configured to cause a radio-frequency signal inputted to a contact selected from a plurality of contacts to be inputted to the first-stage amplifier circuit,
        a control circuit configured to control an operation of the first-stage amplifier circuit and an operation of the second-stage amplifier circuit, and
        a second switch configured to cause a radio-frequency signal outputted by the second-stage amplifier circuit to be outputted from a contact selected from a plurality of contacts.

2. The semiconductor device according to claim 1, further comprising:
    a redistribution layer disposed on the one surface of the first member on which the first conductive raised portion is disposed and one surface of the second member on which the second conductive raised portion is disposed, wherein
    the redistribution layer includes an inter-member connection wire electrically coupling the first electronic circuit and the second electronic circuit to each other and a plurality of pads configured as a base of the first conductive raised portion and a base of the second conductive raised portion.

3. The semiconductor device according to claim 1, wherein
    the second electronic circuit includes the first-stage amplifier circuit.

4. The semiconductor device according to claim 1, wherein
    the first electronic circuit includes the first-stage amplifier circuit.

5. The semiconductor device according to claim 1, wherein
    the first electronic circuit further includes a third switch having
        a transmit-signal input contact configured to receive a radio-frequency signal outputted by the second-stage amplifier circuit,
        a receive-signal output contact coupled to another circuit, and
        a transmit and receive common contact configured to be selectively coupled to either the transmit-signal input contact or the receive-signal output contact.

6. The semiconductor device according to claim 5, wherein
    the first electronic circuit further includes a transmit-side matching circuit configured by a passive element coupled between the second-stage amplifier circuit and the transmit-signal input contact of the third switch.

7. The semiconductor device according to claim 5, wherein
    the first electronic circuit further includes a band pass filter coupled to the transmit and receive common contact of the third switch.

8. The semiconductor device according to claim 7, wherein
    the first electronic circuit further includes a fourth switch having a plurality of antenna-side contacts coupled to an antenna, and
    the fourth switch is configured to select an antenna-side contact from the plurality of antenna-side contacts and couple the selected antenna-side contact to the band pass filter.

9. The semiconductor device according to claim 5, wherein
    the first electronic circuit further includes a low-noise amplifier coupled to the receive-signal output contact of the third switch.

10. The semiconductor device according to claim 9, wherein
    the first electronic circuit further includes a receive-side matching circuit configured by a passive element coupled between the receive-signal output contact of the third switch and the low-noise amplifier.

11. The semiconductor device according to claim 2, wherein
    the second electronic circuit includes the first-stage amplifier circuit.

12. The semiconductor device according to claim 2, wherein
    the first electronic circuit includes the first-stage amplifier circuit.

13. The semiconductor device according to claim 2, wherein
    the first electronic circuit further includes a third switch having
        a transmit-signal input contact configured to receive a radio-frequency signal outputted by the second-stage amplifier circuit,
        a receive-signal output contact coupled to another circuit, and a transmit and receive common contact configured to be selectively coupled to either the transmit-signal input contact or the receive-signal output contact.

14. The semiconductor device according to claim 3, wherein
the first electronic circuit further includes a third switch having
a transmit-signal input contact configured to receive a radio-frequency signal outputted by the second-stage amplifier circuit,
a receive-signal output contact coupled to another circuit, and
a transmit and receive common contact configured to be selectively coupled to either the transmit-signal input contact or the receive-signal output contact.

15. The semiconductor device according to claim 4, wherein
the first electronic circuit further includes a third switch having
a transmit-signal input contact configured to receive a radio-frequency signal outputted by the second-stage amplifier circuit,
a receive-signal output contact coupled to another circuit, and
a transmit and receive common contact configured to be selectively coupled to either the transmit-signal input contact or the receive-signal output contact.

16. The semiconductor device according to claim 11, wherein
the first electronic circuit further includes a third switch having
a transmit-signal input contact configured to receive a radio-frequency signal outputted by the second-stage amplifier circuit,
a receive-signal output contact coupled to another circuit, and
a transmit and receive common contact configured to be selectively coupled to either the transmit-signal input contact or the receive-signal output contact.

17. The semiconductor device according to claim 6, wherein
the first electronic circuit further includes a band pass filter coupled to the transmit and receive common contact of the third switch.

18. The semiconductor device according to claim 6, wherein
the first electronic circuit further includes a low-noise amplifier coupled to the receive-signal output contact of the third switch.

19. The semiconductor device according to claim 7, wherein
the first electronic circuit further includes a low-noise amplifier coupled to the receive-signal output contact of the third switch.

20. The semiconductor device according to claim 8, wherein
the first electronic circuit further includes a low-noise amplifier coupled to the receive-signal output contact of the third switch.

* * * * *